US012813008B2

(12) United States Patent
Wiggs et al.

(10) Patent No.: US 12,813,008 B2
(45) Date of Patent: Nov. 24, 2026

(54) METHOD TO INCREASE ELECTRICAL PRODUCTION OF SOLAR CELLS, SOLAR CELL PANELS, AND SOLAR CELL MODULES

(71) Applicant: ADVANCED STELLAR IRRADIANCE CORPORATION, Franklin, TN (US)

(72) Inventors: B. Ryland Wiggs, Franklin, TN (US); David R. Wiggs, Nashville, TN (US)

(73) Assignee: ADVANCED STELLAR IRRADIANCE CORPORATION

( * ) Notice: Subject to any disclaimer, the term of this patent is extended or adjusted under 35 U.S.C. 154(b) by 0 days.

(21) Appl. No.: 19/278,557

(22) Filed: Jul. 23, 2025

(65) Prior Publication Data

US 2026/0033036 A1 Jan. 29, 2026

Related U.S. Application Data

(60) Provisional application No. 63/732,212, filed on Jul. 23, 2024.

(51) Int. Cl.
*H10F 77/30* (2025.01)
*H10F 19/80* (2025.01)
(Continued)

(52) U.S. Cl.
CPC ........... *H10F 77/311* (2025.01); *H10F 19/80* (2025.01); *H10F 19/85* (2025.01); *H10F 77/42* (2025.01);
(Continued)

(58) Field of Classification Search
CPC ........ H10F 77/311; H10F 19/85; H10F 77/42; H10F 77/63; H10F 77/48; H10F 77/45;
(Continued)

(56) References Cited

U.S. PATENT DOCUMENTS 8,764,207 B2 7/2014 Neff
11,489,484 B2 11/2022 Chentnik et al.
(Continued)

FOREIGN PATENT DOCUMENTS

KR 101969823 B1 * 4/2019 ............. B32B 13/12
WO WO-2019230469 A1 * 12/2019 ............. H10F 77/48
WO 2024132501 A1 6/2024

OTHER PUBLICATIONS

Method of Producing Low-Density, High-Strength Thin Cement Sheets: Pilot Run for a Glass-Free Solar Panel; Jyh-Jeng Deng, et al.; See Materials 2023, 16,7500; https://doi.org/10.3390/ma16237500.

(Continued)

*Primary Examiner* — Earl N Taylor

(57) ABSTRACT

An improved method of at least one of providing increased solar cell/solar panel/solar module (a solar member) electrical production abilities and of providing some increased solar member cooling abilities by at least one of applying/providing a coating, as disclosed herein, directly to and/or within the back-sheet of, a solar member, which coating can one of modify, reflect, and scatter light-waves in a manner advantageous for solar members to produce more electricity than otherwise, and which coating can optionally be applied to the front of a separate surface which is within six meters of a solar member.

37 Claims, 4 Drawing Sheets

(51) Int. Cl.
*H10F 19/85* (2025.01)
*H10F 77/42* (2025.01)
*H10F 77/48* (2025.01)
*H10F 77/63* (2025.01)

(52) U.S. Cl.
CPC ........... *H10F 77/48* (2025.01); *H10F 77/488* (2025.01); *H10F 77/63* (2025.01); *Y02E 10/52* (2013.01)

(58) Field of Classification Search
CPC ....... H10F 77/488; H10F 19/80; Y02E 10/52; H01L 31/18
See application file for complete search history.

(56) References Cited

U.S. PATENT DOCUMENTS

| | | | |
|---|---|---|---|
| 2009/0078249 | A1 | 3/2009 | Liu |
| 2013/0319502 | A1 | 12/2013 | Chawla et al. |
| 2018/0339942 | A1 | 11/2018 | Hilliard |
| 2019/0296171 | A1 | 9/2019 | Chang et al. |
| 2020/0014212 | A1 | 1/2020 | Mousavi |
| 2021/0111668 | A1* | 4/2021 | Sonwalkar .............. H10F 77/42 |
| 2023/0392062 | A1 | 12/2023 | Zhou et al. |

OTHER PUBLICATIONS

International Search Report and Written Opinion related to Application No. PCT/US2025/038945; reported on Dec. 4, 2025.

* cited by examiner

METHOD TO INCREASE ELECTRICAL PRODUCTION OF SOLAR CELLS, SOLAR CELL PANELS, AND SOLAR CELL MODULES

CROSS REFERENCE TO RELATED APPLICATION

This patent application claims the benefit of U.S. Provisional Patent Application No. 63/732,212, filed Jul. 23, 2024.

FIELD OF THE DISCLOSURE

The present disclosures relates to an improved method to provide increased solar cell/solar cell panel/solar cell module electrical production, more specifically by applying and/or providing at least one of the coatings and/or light-wave adjustment means on the back of, and/or behind, and/or in front of, and/or beside, and/or below and/or within a radius of at least six meters (six meters is herein defined as "near") of a solar cell/solar cell panel/solar cell module. Solar panels and/or solar modules typically being comprised of larger solar panels/solar modules (typically around three feet wide and around six feet high, more or less) containing multiple smaller solar cells (typically around six inches wide and around six inches high, more or less), all of which is well understood by those skilled in the art.

BACKGROUND OF THE DISCLOSURE

Generally, a solar cell is comprised of a single silicon, or other material, photovoltaic cell with a positively doped and a negatively doped side, with a positive side wire, or the like (such as a copper foil for example), and a negative side wire, or the like. A "solar panel" is made from wiring together multiple solar cells, via wiring in series (to increase voltage) and/or in parallel (to increase amperage). "Solar modules" comprise photovoltaic cell circuits sealed in an environmentally protective laminate, and contain a "multiple number of solar cells" wired and assembled together with a back-sheet, which back-sheet is typically comprised of a plastic. Solar cells, solar panels, and solar modules are all well understood by those skilled in the art. Generally, there are three common types of solar modules, monocrystalline solar modules, polycrystalline solar modules, and thin-cell solar modules, all of which are well understood by those skilled in the art. A collection of solar panels and/or solar modules that are all connected and spread over a large area is called a "solar array".

As a high-level explanation, solar panels/solar modules are generally comprised of multiple electrically connected solar cells on one side facing the sun, with a clear glass covering, and with a typical sturdy plastic backing behind the interior solar cells to protect against weather. "Bifacial" solar panels typically have multiple electrically connected solar cells on one side facing the sun with a clear glass covering, in addition to multiple electrically connected solar cells on the opposite back side facing away from the sun with a clear glass covering, so as to capture at least one of indirect sunlight, translucent light, and other light waves that may have not been utilized by the front set of solar cells, as is all well understood by those skilled in the art. Generally, solar panels/solar modules are installed in a direction and in a position to maximize exposure to the sun, and may be installed on moveable tracking supports that follow the sun like a sunflower.

SUMMARY OF THE DISCLOSURE

The purpose of the subject disclosures is to increase the electrical output from solar cells, solar modules and/or solar panels, each individually and collectively herein often referred to and called a "solar member".

The present disclosures relate to an improved method to enable solar cells/solar cell modules/solar cell panels (solar members) to produce more electrical power per given area, such as per square meter for example, than afforded by traditional solar cells/solar cell modules/solar cell panels (solar members), and to typically stay cooler than traditional solar members, which also can increase electrical power output, as heated solar members cell panels can degrade both electrical power output and solar member life span, which present disclosures are therefore preferable for most any useful solar member electrical energy supply purpose. Such an improved electrical power production method would at least one of: enable the reduction in size and cost of solar members; enable the reduction in size and cost of at least one of charge controllers, wiring, and inverters; and/or would reduce land area and/or rooftop area requirements for the production of a desired amount of electrical power via solar member electrical production.

The improved method to provide the above-said preferable objectives is accomplished by at least one or more of the following hereinafter disclosed methods.

Various "coating" types are disclosed herein, and may be referred to as a "special coating" and/or as a "coating" when the context clearly is referring to at least one of the special/unique and/or new coatings disclosed herein. When the term "coating" is used with reference to existing and/or already known other type of coatings, the context will indicate such. Further, "a", "an", or "the" is intended to mean "one or more", unless expressly indicated otherwise or unless clearly indicated otherwise by context.

Light can be referred to in terms of both photons and wavelengths, and is composed of electromagnetic radiation. The electromagnetic spectrum is the full range of electromagnetic radiation organized by frequency and wavelength. At least one of the new coatings disclosed herein reflects and/or modifies incoming light waves into light waves that can be utilized for electrical production in solar members (generally light waves with about 350 nanometer (nm) wavelengths to 1,100 nm wavelengths for silicon solar cells, as an example, while visible light wavelengths are reportedly about 400 nm at the violet end of the spectrum to around 700 nm at the red end of the spectrum).

However, at least one of the new coatings disclosed herein enables additional and longer (longer than about 1,100 nm in length) wavelengths of the electromagnetic spectrum, such as radio waves, or the like, to be utilized to reflect and/or to modify incoming electromagnetic waves to be utilized for electrical production in solar members, with such electromagnetic waves extending to a length of up to about 100 meters.

The photovoltaic effect, which is well understood by those skilled in the art, is where two dissimilar materials in close, but not direct, contact produce an electrical voltage when struck by light or other radiant energy source. For example, electrons in crystals of silicon or germanium are bound and are usually not free to move from atom to atom within the crystals. However, when the electrons are stuck by certain light and/or radiant energy wavelengths, enough additional energy is provided so as to free some electrons from their original bound condition. The freed electrons cross the junction between two dissimilar crystals, leaving a "hole"

where the freed electron used to be, with the freed electron moving in one direction more easily than the other, thereby creating an electrical current, giving one side of the junction a negative charge and voltage with respect to the other side, which is now more positively charged. As long as light and/or radiant energy, within certain favorable wavelengths, continues to strike the crystals, the photovoltaic effect will continue to provide voltage and an electrical current. The current produced can be equivalent to the brightness and/or intensity of the striking light, and can be used as a source of electrical power in an electrical circuit.

Generally, “solar cells” (also called photovoltaic, or PV, cells) use the photovoltaic effect to convert sunlight into useful electricity. To lessen incoming light reflective losses from their typical glass front covers, a silicon monoxide (SiO), or the like, coating is often applied as a coating for the top “front” glass cover of the solar cells.

Generally, “solar cell panels/solar cell modules” comprise “multiple solar cells” wired together in series, or in parallel, or in mixed series and parallel wiring to increase both amps and volts, as is well understood by those skilled in the art. Solar cell panels/solar cell modules are capable of producing useful electrical currents under high potential differences. Electric potential difference and electric current flow can be better understood by using the analogy of water flowing down a steep hill. At the top of the hill, the water has a lot of stored gravitational potential energy. Similarly, an electron has a lot of stored energy in the form of electric potential energy when it is at the negative terminal of a battery. The water at the top of the hill will naturally flow and fall downward toward the lower ground where its potential energy is lower. The electron at the negative terminal of a battery has a high electrical energy level and will naturally flow toward the positive terminal, where the electric potential energy is lower. As the water falls downward, its stored energy potential is converted to kinetic energy (energy produced due to its motion, such as powering a waterwheel or a turbine). As the electron flows across electrical components, the stored energy is converted into various forms of energy such as heat, light, and mechanical energy such as powering a motor.

Solar cells may also include, but are not limited to, the following exemplary types of solar cells: Amorphous Silicon solar cell (a-Si), Biohybrid solar cell, Cadmium telluride solar cell (CdTe), Concentrated PV cell (CVP and HCVP), Copper indium gallium selenide solar cells (CI(G)S), Crystalline silicon solar cell (c-Si), Float-zone silicon, Dye-sensitized solar cell (DSSC), Gallium arsenide germanium solar cell (GaAs), Hybrid solar cell, Luminescent solar concentrator cell (LSC, Micromorph (tandem-cell using a-Si/μc-Si), Monocrystalline solar cell (mono-Si), Multi-junction solar cell (MJ), Nanocrystal solar cell, Organic solar cell (OPV), Perovskite solar cell, Photoelectrochemical cell (PEC), Plasmonic solar cell, Polycrystalline solar cell (multi-Si), Quantum dot solar cell, Solid-state solar cell, Thin-film solar cell (TFSC), amorphous silicon solar cell, wafer solar cell, or wafer-based solar cell crystalline, and all other types of solar cells, such as, for example, all solar cells in the categories of solar cells, silicon solar cells, thin-film solar cells, infrared solar cells, perovskite solar cells, tandem solar cells, multi-junction solar cells, and solar cells using a combination of carbon nanowires and nonphotonic crystals, and the like.

Generally, many solar members are one of three basic types, namely, silicon mono-cell, silicon poly-cell, and silicon thin-cell, all of which are well understood by those skilled in the art. Thin-film solar cells, as an example, may also be made of cadmium telluride, of copper indium gallium selenide, of gallium arsenide (GaAs), of an Amorphous silicon, (which is the non-crystalline form of silicon), or the like, as is all well understood by those of skill in the art.

Bi-facial solar modules and/or bifacial solar panels (a solar module/solar panel with solar cells on both the front side and the back side, as is well understood by those of skill in the art) may also be utilized in conjunction with at least one of the coatings disclosed herein, which coating provides an operational efficiency enhancement for solar members of most any type. However, when a coating, as disclosed herein, is utilized in conjunction with a bi-facial solar panel/solar module, the coating is not directly placed on the back-side of the solar panel/solar module, as this would block in-coming light. Instead, the coating is placed on a separate surface, such as a board, or the like, that is placed behind and/or below and/or beside the bi-facial solar module.

Generally, most current solar members utilized are silicon mono-cell type solar members. This is because, even though generally more costly than silicon poly-cell solar members and silicon-based amorphous thin-cell solar members, silicon mono-cell panels typically produce more electrical power from the same surface area size. However, while both silicon mono-cell and silicon poly-cell solar members generally produce more power than silicon amorphous thin-cell solar members of the same size, such said thin-cell solar members are generally the least costly and have the lightest weight. Therefore, using silicon amorphous thin-cell solar members for the electrical power source, in conjunction with the disclosures herein, could sometimes be preferable, although the use of any other type of solar member in conjunction with the disclosures herein, would also be advantageous.

It would clearly be advantageous for solar members to have an enhanced electrical output efficiency greater than that of current traditional solar members. The means for an increased and cost-effective electrical output from solar members advantageously facilitates the use of solar members for multiple electrical purposes that might otherwise be questionable.

Regarding an increase in solar member efficiency (an increase in efficiency meaning an increase in electrical output), at least one of a coating, as disclosed herein, could be added near to, and/or on the back rear-side of a solar member alone, or in conjunction with another invention on the top front face of a solar panel/module that increases electrical output, such as, for example, a meta-material and/or an artificial optical material with a 3-D structure that bends light at the top front face of a solar cell so as to artificially reflect and/or direct initially incoming sunlight/solar radiation into a solar cell in a manner which bends the incoming solar light/radiation from multiple angles of incidence and directs them into the solar members. A metamaterial is well understood by those skilled in the art, and is a material engineered to have a property that is not found in naturally occurring materials, and is reportedly commonly made from metal and/or plastics and/or silica.

There are other inventions and techniques reportedly designed, or under development, that can reportedly increase solar member efficiencies. Such coatings and techniques include, as examples, a top coating by Xerocoat, that reportedly increases efficiencies from 3% to 6%; a top anti-reflective coating to mitigate light reflection losses; a top coating to reduce soiling on the top of solar panels, called Wattglass, developed under national Science Foundation funding with the University of Arkansas; a way to "theoretically" (still unproven) potentially increase efficiencies by up to 30%, developed by the University of California Riverside, which combines inorganic semiconductor nanocrystals with organic molecules within the solar cell so as to "upconvert" photons coming into the front of solar cells in the visible and near-infrared regions of the solar spectrum; a way to "theoretically" (still unproven) potentially increase solar cell voltage by up to 40%, and to increase power conversion efficiencies from 3% to 4% up to 5.2% to 5.6%, developed by Northwestern University, by coating the solar cell anode with a 5 to 10 nanometer thick layer of nickel oxide, which reportedly improves conductivity by extracting holes from an irradiated cell, and which also acts as an efficient "blocker', which prevents misdirected electrons from staying to the "wrong" anode electrode, which would otherwise inhibit cell energy conversion efficiency; and the University of Cambridge has reportedly developed a way to "theoretically" (still unproven) potentially increase the maximum Shockley-Quessier solar cell efficiency limit from 33.7% up to a potential 46% efficiency level, using an internal solar cell composite mixture of pentacene (an organic semiconductor) with nanocrystals of lead selenide (an inorganic compound), so as to generate two electrons from high-energy photons, as opposed to only one electron per photon, as in current solar panels. However, none of the above-said inventions and/or techniques utilize a coating, as disclosed herein, that is applied directly to, and/or that is placed in close proximity to (meaning within about six meters of, behind, and/or in front of, and/or beside, and/or below) a solar member, as disclosed herein, which coating has evidenced efficiency average gains from at least about 10% to over 100% on various types of solar members tested. Further, the coatings disclosed herein, due to their unique characteristics, would be anticipated to work in conjunction with, rather than to be a substitute for, the other inventions and techniques described hereinabove, so as to even further enhance any such theoretical solar cell/solar panel/solar module efficiencies. Factually, should some theoretical new invention, other than at least one of the coatings disclosed herein, actually increase solar member electrical output by 30%, or more, the addition of at least one of the coatings disclosed herein would still be anticipated to increase the new, higher, electrical output by about 10% to 100%, or more.

While at least one of the unique coatings disclosed herein could optionally be placed directly on the back of solar members, at least one of the special/unique coatings may also optionally be placed on one side of a separate surface of a substrate. The separate surface could be at least one of a board (substrate), a plastic sheet (substrate), a metal sheet (substrate), a foam board sheet (substrate), a mylar sheet (substrate), a metal foil-backed foam board sheet (substrate), or the like. The coated separate surface would then be placed at least one of below, beside, and/or behind the back-side of a solar member (with the coated side directly facing the back side of the solar member). Generally, via placing such a separate coated surface behind and/or beside and/or below a solar member can act to increase electrical output of the solar member if within at least about six meters, or more, of the solar member. When placed behind and/or in front of a solar member, adequate space must be left between the separate coated surface and the solar member to permit useable light to pass into the solar member.

By utilizing such a coated separate surface with a special coating, as disclosed herein, the electrical output efficiency of the solar member, with special coating application, remains within about 60% to 100% of that of a solar member that has the special coating directly applied to its back side, or back-sheet. In some instances, an electrical output efficiency gain above a directly coated solar member, via utilizing a coated separate surface of a substrate, can even be realized. Thus, via simply screwing, bolting, gluing, velcroing, or otherwise attaching, such a pre-manufactured separate surface of the substrate, with the special coating already pre-applied to the one side that will face the back and/or the side and/or the bottom of the solar member, saves time and expense in otherwise having to directly apply the coating to pre-installed and/or new solar members.

Further, utilizing such a coated separate surface could even be advantageous for newly manufactured and yet uninstalled solar members, since a new manufacturing process does not have to be added to an existing solar member manufacturing process, and/or since no extensive and costly testing would be necessary for a completely new solar member design (such as extreme temperature testing, accelerated 25-year life testing, etc.), as would all be well understood by those skilled in the art. Optionally, the separate surface itself could be one of partially and totally comprised of at least one of the coatings disclosed herein.

While at least one of the coatings disclosed herein could optionally be placed directly on the back of solar members, and/or on a separate coated surface of a substrate, at least one of the coatings may also optionally be placed within and/or embedded in, the back-sheet of a solar member itself. As used herein "within a back-sheet" means that at least one of the coatings disclosed herein is embedded within, and/or forms an actual integral part of, the back-sheet of a solar member. As is well understood by those of skill in the art, the back-sheet of a solar member is typically comprised of a durable type of plastic, which plastic typically comprises the final protective covering on the back side of a solar member.

While at least one of the special coatings disclosed herein will work on multiple types of solar members, the special coating(s) would preferably be utilized in conjunction with solar members, inclusive of thin-film solar members, that are constructed with at least one of a plastic back-sheet so that the back-sheet, together with the coating, is preferably no more than five millimeters thick, and/or that has an acrylonitrile butadiene styrene (ABS) type plastic back-sheet and/or that has a BoPET (Biaxially-oriented polyethylene terephthalate) plastic type backing material (a backing material is commonly called a "back-sheet", which is well understood by those of skill in the art), or the like, so as to further enhance the electrical production ability of the solar member in conjunction with the special coating(s) disclosed herein.

Further, at least one of the special coatings disclosed herein, acts to improve the heat exchange rate from solar members, so as to assist in cooling, especially at temperature ranges above around 25 degrees Celsius (C). This is important, because as reported, each one-half degree C. increase above 25 degrees C. can decrease solar cell electrical output efficiencies about 0.5 percent.

As used herein, some special coating components will be named, and some will be identified by their component symbols and/or formula units, all of which are well understood by those skilled in the art. For example, sand is predominately composed of Silicon Dioxide, with a corresponding component symbol and/or formula unit of SiO2. Also, as used herein, "Cement" and/or "Portland Cement" means any cement mixture containing at least 70% Portland Cement, or the like, such as a cement patching mix, a quick/fast setting cement patching mix that includes cement curing accelerators, a Sakrete, a Quikrete, or the like. Cement, Portland Cement, cement patching mixes, Sakrete, Quikrete, and cement curing accelerators are all well understood by those skilled in the art, and, unless pre-mixed, require the addition of a liquid (such as water, liquid paint, a liquid paint primer, a liquid enamel, or the like) to be utilized in a paste form for ease of attachment to solar members. Also, as used herein, the terms "cement curing accelerators" and/or "cement accelerators" are used interchangeably, and both refer to additives which assist in accelerating the drying time of cement, and such additives are all well understood by those skilled in the art.

The primary and preferred methods of increasing the electrical output of solar members are disclosed herein by means of applying a special coating near to (as previously mentioned, "near" herein meaning within about 6 meters) and/or directly to the back of solar members, and/or to the back-side and/or to the back-sheet of solar members. The preferred content of the special coating has multiple optional component and combination types, which multiple optional component and combination types are disclosed herein.

The preferred method of cooling a solar cell/solar cell panel/solar cell module is also disclosed herein by means of applying a coating (comprised of at least one of the coating types disclosed herein), to the exterior of the back of a solar member and/or to the exterior of the back-side and/or to the exterior of the back-sheet of a solar member. However, the electrical output increase occasioned by application of at least one of the coatings disclosed herein is generally well beyond that occasioned by a cooling effect alone.

The solar industry currently works on increasing solar member electrical output/efficiencies by means other than by an application of the special coatings disclosed herein. Generally, the solar industry works to increase efficiencies by at least one of decreasing and/or re-arranging internal wiring, modifying the solar cell composition itself, re-arranging internal components, decreasing incoming light reflection, and/or by adding a meta-material, or the like, to the front of a solar member so as to bend incoming light more directly into the solar member, as previously mentioned above.

Thus, generally, in the solar industry, additional electrical output is based upon maximizing the use of light entering into and through the front of solar members, and/or is based upon direct and/or translucent and/or indirect light simply being elastically reflected into solar members by means of a mirror or similar purely elastically reflective surface. It is well-known that purely elastic reflective surfaces can increase solar panel electrical productivity by up to 5%, or more, depending on the amount of additional "mirrored" light that is directly or indirectly reflected into the solar members. However, via the use of at least one of the coatings disclosed herein, any additional electrical productivity increase by virtue of such known elastic reflective advantages can be proportionately increased by an average of about 10% to 100%, or more.

When photons and/or electrons are reflected, they can lose energy. If there is no to insignificant energy loss, the reflection is referred to as elastic scattering. If there is a significant energy loss, the reflection is referred to as inelastic scattering. Thus, when referring to light, an elastic reflective surface is a surface that does not change, or that only very minimally changes, the wavelength of light when reflected by a reflector such as mirror, or the like, while an inelastic scattering of light might occur from rougher surfaces than that of a mirror, and more significantly results in changes of light wavelengths when the light is reflected, such as being reflected from a prism, a crystal, or the like.

However, here, the subject disclosed coatings act to reflect and/or scatter and/or modify the wavelengths of translucent and/or indirect light back up into and/or through a solar member at existing and/or altered useful positive light wavelengths that can be used to eject electrons from their valance band into the conduction band in solar members, so as to generate a greater than otherwise possible electric current. Valence bands and conduction bands, as well as multiple types of light scattering effects and of light wavelength altering effects, are well understood by those skilled in the art.

Here, the subject disclosed coatings, applied directly to the back of solar members and/or applied to a nearby solid (or substantially solid) separate surface, such as a board, or the like, act to both elastically and inelastically reflect and/or scatter light and/or act to create a positive electromagnetic reflective and/or scattering effect and/or a positive wavelength change effect as such light and/or modified light enters into both directly coated solar members, as well as into surrounding uncoated solar members, so as to increase electrical output in both directly coated solar members and into surrounding uncoated solar members.

There are varying component percentages in the multiple coating designs disclosed herein. This is because there are varying manufacturing designs for solar members, such as, for example, varying front glass types, varying silicon types, varying PN junction types, varying wiring designs, varying types and/or thicknesses of plastic (or other) backing/backsheets, etc., as is all well understood by those skilled in the art. For example, as is also well understood by those of skill in the art, respective differing glass front covers on solar panels/solar modules can perform differently under direct and/or diffuse solar irradiance. Therefore, because the actual material components and designs utilized in any particular solar member product vary, the design and/or percentages of coating components in the multiple coatings disclosed herein vary, in order to provide multiple options to enable optimized results for particular and varying solar member design products.

As also previously noted, generally, all presently known improvements to solar members are related to coatings applied to the front surface, such as metamaterials to bend light into the solar cells, such as materials to prevent light reflection away from the solar cells, such as materials to keep front surfaces clean, and the like, as well as internal improvements to the solar cells/solar modules/solar panels themselves, such as wiring designs, doping material designs (doping for positive and negative surfaces is well understood by those skilled in the art), silicon thickness, or other solar cell component material thicknesses, and the like. Thus, applying a coating comprised of a material that is dry, and/or that dries to a solid material type, as disclosed herein, which coating is opaque to light waves typically utilized by solar members to produce electrical power, to and/or near to the back of a solar member is a new, unique, and advantageous design improvement method to increase electrical output/efficiencies, with some additional solar member cooling advantages also sometimes being provided, for varying, respective, and multiple types of solar members.

Application of the coatings disclosed herein, while sometimes providing advantageous cooling effects, result in the production of far more electrical output than can be generated by cooling alone. It is well known that cooling solar members can be effected by running water, or the like, and/or by applying a graphene coating to the back of the panels/modules. However, solely applying a graphene coating to the back of solar members reportedly can only provide about a 4% maximum efficiency increase in very hot weather. Here, depending on weather conditions, such as sunny or cloudy conditions, the disclosed coatings can provide approximate 10% to 40%, or more, daily average efficiency/electrical output increases, under a standard utility company grid load, which is well beyond any currently known cooling advantage alone. A standard utility company grid load is well understood by those of skill in the art.

As is well understood by those of skill in the art, the spectral response of solar members to solar irradiance is an important factor in the design of solar members. Solar irradiance levels are also well understood by those skilled in the art, and are measured via watts of solar/light energy per square surface meter of solar members. Generally, as is well understood by those skilled in the art, as solar irradiance levels decrease (such as when the sun is at lower elevations and/or when cloudy, hazy, or the like), the electrical output to the solar irradiance ratio decreases. However, via utilizing and providing at least one of the coatings disclosed herein, generally, as solar irradiance levels decrease, the electrical output to the irradiance ratio increases. While most solar members and most solar member efficiency improvements are intended to increase electrical output/efficiencies as solar irradiance levels increase, such as during high solar irradiance conditions, such as around a 1,000 solar irradiance (1,000 watts per square meter of surface area), or greater, level for example, as related, the efficiency percentage improvement levels occasioned by the coatings disclosed herein provide an opposite effect, and generally increase efficiency/electrical output percentages as solar irradiance levels decrease. Thus, applications of the coatings disclosed herein are extremely advantageous during periods of cloudy/rainy weather, when standard and uncoated solar member electrical output efficiencies are typically at their worst.

When solar cell Direct Current (DC) current is converted into alternating Current (AC), devices called inverters are used, which is well understood by those of skill in the art. Because of typical very low solar cell electrical output efficiencies during periods of low solar irradiance, such as solar irradiances of about 100, or less, solar field inverters are generally programmed to shut-off during such low-level solar irradiance conditions. However, via application of the coatings disclosed herein to solar members in a solar field/solar array, since electrical output/efficiency percentages will increase as solar irradiance levels decrease, inverters could and/or should be programmed to shut-off at lower solar irradiance levels of no more/no greater than seventy (70), as such lower solar irradiance conditions could and/or would result in additional positive electrical supplies and/or revenues.

Generally, as is well understood by those skilled in the art, electrical power is produced by solar members when an electron is knocked out of its valence band and into a conduction band.

Bands containing electrons that are the closest to the nucleus of a silicon atom are called core levels, while the band with electrons that are the furthest from the nucleus is called the valence band. These "bands" around the nucleus keep their respective electrons in place within their respective bands. The next band out beyond the valence band is called a conduction band, where electrons are not bound to the nucleus of an atom and are free to move around.

When enough extra energy is provided to knock electrons in a solar cell, such as, for example, a silicon solar cell, out of their valence band and into the conduction band, an electrical current can be created for useful work. Such extra energy, sufficient to knock an electron out of its valence band and into the conduction band can be provided by a photon of light.

Photons have multiple and varying energy levels and wavelengths. Generally, the shorter the wavelength, the higher the energy level. Differing energy levels are required to knock an electron out of its valence band and into the conduction band in differing materials. Energy levels of electrons can be measured in electron volts (eV) and energy levels of photons can be measured in wavelengths. It has been reported that photons with wavelengths in the approximate 350 nanometer (nm) to approximate 1,100 nm range can provide enough energy to knock electrons in silicon out of their valence band and into the conduction band of a silicon atom.

However, if a photon has too much energy (such as a photon with greater than a 1,100 nanometer wavelength, which adds more than about 3.5 eV to an electron when the photon hits the electron, for example), the photon's high energy level can at least one of knock the electron clear out of both the silicon valence band and the conduction band, and the high energy of the photon transmitted to the electron is lost for creating useful work (an electron flow) via a silicon solar member, and/or the photon's high energy level can knock the electron into the conduction band, with the photon's extra energy being primarily lost as heat, which heat can adversely affect solar member efficiencies and/or longevity. Similarly, if a photon has too little energy (such as less than a 350 nanometer wavelength, adding less than about 1.1 eV to an electron when the photon strikes the electron, for example), there is not enough energy to be absorbed by the electron to knock it out of the silicon valence band and into the conduction band, and the low energy of the photon is lost for creating useful work (an electron flow) in a silicon solar member.

Consequently, a cost-effective method/means for converting electrons, that have been hit by photons with at least one of too high of an energy level and with too low of an energy level to knock an electron into the conduction band of a solar cell, such as a silicon solar member for example, into electrons with energy levels that can be knocked into the conduction band, so as to create an electrical flow for useful work, would be advantageous.

Due to theoretical limits on the electrical output/efficiency of various types of solar members (such as via the Shockley-Queisser theory which limits the maximum possible efficiency of a conventional single p-n junction silicon solar cell to around 30% to 34%, under standard solar illumination, at a 1.5 atmosphere), most known solar member electrical output improvements, as referenced, are currently concentrated around one of solar cell material composition; internal adjustments, such as electrical wiring types/arrangements, material thickness, etc.; metamaterials designed to bend angled light more directly into the solar members; front glass reflection reduction methods; internal nanostructured solar cell surfaces and/or internal nanowires; and cooling means, since as said, generally, for every one degree Centigrade (C) of heat increase above twenty-five C, a solar module can lose around a half percent of efficiency.

Thus, via various theories, such as the Shockley-Queisser theory for example, around two-thirds of available solar energy cannot be converted into useful work by silicon solar members. However, this is based on a one-time pass of light/photons through the solar cell.

Side light reflectors, comprised if mirrors, or the like, as previously referenced, are well-known as a means of increasing solar member electrical output via elastic reflection. However, such side light reflectors simply reflect additional direct sunlight into the solar members, and do not change, or only minimally change, the wavelength and/or the electrical volt (eV) energy of the direct light source, which is usually the sun.

In order to utilize more of the theoretical “unusable” energy from the light source, which is typically the sun, at least one of the excessively high level currently theoretical mostly “unusable” solar/photon energy and the excessively low level currently theoretical “unusable” solar/photon energy needs to either be directly adjusted and/or reflected so as to provide an appropriate and usable energy level to send affected electrons into the conduction band of a solar member, such as a silicon solar member for example, or the affected electrons need to be changed into a “usable” energy level that can effectively send affected electrons into the conduction band of a solar member, such as a silicon solar member for example, so as to create an electrical current which can be utilized for useful work.

Such a cost-effective improved method/means of increasing the electrical production/efficiency of solar members, is provided by a method of applying at least one of the coatings disclosed herein, which acts to appropriately adjust the energy level of available photons so as to be knocked into the conduction band of a solar member of most any material composition. Adjusting photons with too high of an energy level (above about 3.5 electron volts for silicon solar cells, as an example) to a deceased energy level is called “down-conversion”. Adjusting photons with too low of an energy level (below about 1.1 electron volts for silicon solar cells, as an example) to an increased energy level is called “up-conversion”. Appropriately adjusting the energy level of otherwise un-useful photons, into photons with energy levels that can be absorbed by the electrons in the silicon’s, or any other solar member material’s, conduction band so as to create an electrical flow for useful work, would be effected by utilization of at least one of the coating methods disclosed herein, utilizing at least one of the coatings disclosed herein, which enables the use of conventionally “un-useful” solar energy, all without any material violation of the Shockley-Queisser theory, as an example, itself.

It is known that down-conversion can be accomplished via the use of a quantum dot solar cell, which is a solar cell internally comprised of quantum dots. While quantum dot solar cells can provide various electrical output advantages, such as via their ability to favorably modify light wavelength/photon energy levels, quantum dots have longevity/degradation concerns, have air/moisture exposure concerns, have ultra-violet light exposure concerns, can be highly toxic, and could adversely affect human organs/tissues. Further, quantum dot solar cells, although theoretically being able to attain high efficiencies, have reportedly not yet even been able to attain the efficiency outputs of conventional silicon and/or other type (such as cadmium-telluride, etc.) solar members. Further, quantum dot solar cells are internally comprised of quantum dots. The quantum dots are not placed on the back-side of, or near to, conventional silicon or other solar member types, as are the coatings disclosed herein.

The subject new coatings disclosed herein, when applied to the back of and/or near a solar member of multiple types (as opposed to being an internal solar member component like quantum dots), are rugged, have no known long-term issues, are cost-effective, and have no significantly hazardous materials, as the coating’s basic components are commonly and routinely utilized worldwide. The subject coatings disclosed herein are not disruptive (do not replace any type of actual solar cell), but act to only increase the electrical output of existing solar members, having done so on every type of solar member tested thus far, inclusive of silicon mono-cell, silicon poly-cell, silicon thin-film amorphous, and cadmium telluride solar members.

Electrons, like light/photons, can also be reflected. Reportedly, the reflection of electrons from various materials is a key concept in quantum mechanics, and is described by wave-particle duality, where the behavior of electrons is similar to the reflection of waves.

Therefore, similar to at least one of utilizing a solar and/or light energy dissipation and a solar and/or light energy dispersion to down-convert (reduce energy) and/or to upconvert (add energy) to positively and advantageously affect photons for use in a solar member, a cost effective coating that can positively affect and/or reflect both positively affected photons and electrons with energy levels that have been modified from being one of too high and too low, so as to cause advantageously modified photons and/or electrons to travel into a conduction band in a solar member of any type, so as to create an electrical flow and have the potential of performing useful work, would also be advantageous. At least one of the coatings disclosed herein provides such an advantage.

It is reported that in inelastic scattering, some of the photon’s/electron’s kinetic energy is transferred to the atoms in the object/material it strikes and is reflected from. Such a collision causes excitations in the material the photon/electron strikes, such as vibrations, modified energy levels, or other electronic excitations. When an electron strikes a material that causes it to lose electron-volt energy, the energy lost can be emitted in the form of photons of light, which is a quantum of light. Such a process is referred to as radiative recombination, or the emission of secondary radiation. Such emitted light can be in differing and multiple wavelengths.

As previously explained, when photons and/or electrons are reflected, they can lose energy. If there is no to insignificant energy loss, the reflection is referred to as elastic scattering. If there is a significant energy loss, the reflection is referred to as inelastic scattering.

Also, other reported potential effects of high-energy electrons striking a material could result in the Bremsstrahlung Radiation effect (a continuous spectrum of X-ray photons), and/or ionization of atoms in the material being struck, and/or heat generation in the material being struck. It is also reported that high-energy electrons can cause the ejection of secondary electrons from the material they strike. Such secondary electrons typically have lower energy levels than the original high-energy electron. Such reflected lower-energy electrons typically send the lower-energy electrons outwardly in random directions.

Reportedly, when a charged particle (typically an electron) moves through a material, it experiences forces due to the Coulomb fields of atomic nuclei and other electrons. If these forces alter the trajectory of the particle, it undergoes acceleration or deceleration. According to classical electrodynamics (reportedly described by Maxwell’s equations), an accelerating charge must emit electromagnetic radiation. This emission is called Bremsstrahlung Radiation. The energy lost by the decelerating electron is emitted as photons, which can have a wide range of energies, including visible light, ultraviolet, and X-rays. The Bremsstrahlung photon energy depends on the degree of deceleration, with higher energy losses producing more energetic radiation. Thus, Bremsstrahlung Radiation can also result from a charged particle moving through a material, such as a material comprised of at least one of the coatings disclosed herein, that results in the emission of photons with energy levels in the range that is useful in solar cells (about 1.1 eV to 3.5 eV). Such additional photons, that are useful in solar members, can be reflected and scattered in multiple directions, included into the solar member from its backside, so as to be able to produce more electricity.

Consequently, high-energy photons and/or high-energy electrons (photons and/or electrons having above 3.5 electron volts, as an example), after striking a material such as at least one of the coatings disclosed herein, and/or such as granular or powdered salt, limestone, cement, granite, sand, sandstone, white sand, quartz, quartz sand, phosphor crystals, down-conversion crystals, or the like, as examples, and losing some amount of energy, can result in the random scattering of now lower energy photons and/or electrons (below 3.5 electron volts, as an example). Such scattered lower energy photons and/or electrons can positively affect solar members located within at least about a 6 meter radius, so as to increase the electrical output of nearby solar cells/solar panels/solar modules, as the scattered, now lower energy, photons can eject electrons into the conduction band of a solar member, and/or the now lower energy electrons, with a new energy level between about 1.1 eV and about 3.5 eV, can transition into the conduction band of nearby solar members. This results in enhanced electrical output of both coated and non-coated solar members, such as a silicon solar member for example, within at least about a 6 meter radius of the herein disclosed coatings.

It is reported that when a photon strikes a material, such as a gas, a liquid, or a solid material, there is an inelastic scattering of the photon (called Raman scattering). When the photon is shifted toward the red end, internal energy is added to the material struck and the photon loses energy (called Stokes Raman scattering). When shifted toward the blue end, internal energy of the material struck is added to the photon (called anti-Stokes Raman scattering). Thus, via striking at least one of the special coatings disclosed herein, via at least one of the resulting Stokes Raman and anti-Stokes Raman scattering effect, an un-useful photon can at least one of lose energy and gain energy, so as to be able to transition an electron out of the valence band and into the conduction band of a solar member.

Also reportedly, when a high energy photon collides with a lower energy electron, the photon scatters and loses some energy and its wavelength is decreased. Conversely, the lower energy electron gains some energy in the form of electron volts. This is called Compton scattering, or the Compton effect, which effect was reportedly first discovered in the year 1923 by Arthur Holly Compton. Further, it is reported when a high energy electron collides with a low energy photon (such as a photon in the infrared range, as an example), the high energy electron can transfer energy to the low energy photon (called inverse Compton scattering), thereby increasing the wavelength of the photon. Compton scattering is the main attenuation mechanism of x-rays that provides the contrast in medical x-ray photographs. Thus, via striking at least one of the special coatings disclosed herein, via at least one of the resulting Compton scattering effect and inverse Compton scattering effect, an un-useful photon can at least one of lose energy and gain energy, so as to be able to transition an electron out of the valence band and into the conduction band of a solar member.

As mentioned, when energy is transferred to or from a photon and/or an electron via interaction with another object/material, resulting in modified photons and/or electrons being emitted, the effect is termed inelastic, and when a photon and/or an electron interacts with another material and there is no to very minimal change in the energy level of the photon and/or an electron, the effect is termed elastic. One example of elastic scattering would be a scattering of photons in the visible light range (which can be used by most solar cells to produce an electric current), resulting from the photons interacting with particles smaller than the wavelength of the light, which is called Rayleigh scattering. Thus, via striking the materials/particles in at least one of the special coatings disclosed herein, via the resulting Rayleigh scattering effect, photons with useful wavelengths can be scattered in all directions so as to be able to transition an electron out of the valence band and into the conduction band of a solar member.

It is also reported that Debye or Mie scattering is another elastic scattering mechanism which occurs from relatively large particles or molecules with dimensions comparable with the wavelength of the incident radiation, or larger, and the resulting scattered radiation is non-uniform. The effect is not very wavelength dependent. This process is said to form the white scattered light seen in clouds or fog. Therefore, via striking the materials/particles in at least one of the special coatings disclosed herein, via the resulting Mie scattering effect, photons with useful wavelengths can be scattered in all directions so as to be able to transition an electron out of the valence band and into the conduction band of a solar member.

Additionally, it is reported that Brillouin scattering is an inelastic scattering mechanism which typically occurs in light scattering from solid materials. The incident radiation wavelength is modified by the energy levels of sound waves or Phonons in the solid material which is typically very small shifts. Thus, any Phonons in any of the special coatings could also result in a Brillouin scattering effect, so as to scatter useful photons in all directions so as to be able to transition an electron out of the valence band and into the conduction band of a solar member.

Lastly as another scattering effect described herein, Thompson scattering is reportedly an elastic scattering mechanism where light is scattered by charged particles. A comparable form of scattering mentioned above, called Compton scattering, is an inelastic form of Thompson scattering which occurs when the energy of the incident radiation starts to become comparable to the rest energy of the charged particle. Therefore, via striking the materials/particles in at least one of the special coatings disclosed herein, and/or via striking any charged particles resulting from any interaction with at least one of the special coatings disclosed herein, via the resulting Thompson scattering effect, photons with useful wavelengths can be scattered in all directions so as to be able to transition an electron out of the valence band and into the conduction band of a solar member.

Therefore, use of at least one of the coatings disclosed herein, can result in advantageous elastic and/or inelastic scattering of photons and/or electrons off of and/or through at least one of the special coatings disclosed herein (via one or more of the above-said Bremsstrahlung Radiation and/or other above-said scattering effects), so that the scattered photons and/or an electrons are sent back through the solar member which is directly coated, or which has a nearby coated separate (preferably solid or substantially solid) surface, such as a board, or the like, as well as through other nearby uncoated solar members, so as to effectively increase their electrical output.

Therefore, a method of increasing the electrical output of one and/or more solar members by means of providing at least one of the coatings disclosed herein, in at least one of the manners disclosed herein, so as to effect at least one of an elastic and an inelastic scattering of photons and/or electrons off and/or through at least one of the primary and/or final coatings disclosed herein, so that the scattered photons and/or an electrons are sent back through the solar member which is directly coated, or which has a coated separate solid or substantially solid surface, or the like, behind it, as well as through nearby uncoated solar members.

The coatings disclosed herein, when applied to the backside of a solar member, and/or when applied to a separate (preferably solid or substantially solid) surface near a solar member, are presently believed to reflect and/or modify and/or elastically scatter and/or inelastically scatter at least one of photon and electron energy levels into energy levels favorable for electrical production in solar members via at least one of the Bremsstrahlung Radiation, Stokes Raman scattering, anti-Stokes Raman scattering, Compton scattering, Rayleigh scattering, Debye or Mic Scattering, Brillouin scattering, Thompson scattering, or the like, which are all well understood by those skilled in the art, and/or the special coating may also act to utilize and/or produce electromagnetic waves ranging in size from about 300 nanometers to 100 meters long (long electromagnetic waves, in the meter to multi-meter range, can be referred to as radio waves).

Thus, as a result of one or more of the above-said effects and/or of the above-said scattering effects, and/or of the above-said energy altering effects, after striking at least one of the coatings disclosed herein, at least one of electrons and photons are randomly reflected and/or scattered in multiple directions so as to now be able to move additional (more than otherwise if the special coating was not applied) electrons into the conduction band of both coated and nearby uncoated solar members.

It is also reported that a reflective material, such as aluminum foil or aluminum sheets, mylar reflective sheets, polished metal sheets, or the like, and a reflective material, such as white and silver paints, white and silver enamels, or the like, can reflect some translucent light back into a solar cell, but such reflective advantages are only reported to typically be in the 5% range for efficiency increases, and are believed to only be most advantageous and effective during high solar irradiance conditions (high meaning about a 900, or greater, solar irradiance/watts per square meter level). The subject special coating can not only increase translucent light electrical output efficiencies by significantly more than 5% in high solar irradiance conditions (up to about 10%, or more), but can increase electrical output efficiencies by up to about 40%, or more, in low solar irradiance conditions (low meaning about 1 to 200 solar irradiance conditions). Further, the subject special coating acts to additionally proportionately increase (by up to 10%, or more) any other light (other than translucent light) that may be reflected into a coated solar member and/or into a nearby uncoated solar member.

However, when utilizing the coating materials disclosed herein, reflective advantages can be accentuated well beyond that of the simple reflective advantages for ordinary uncoated solar members. Therefore, it is advantageous to utilize a reflective means that is placed/applied behind any coating material disclosed herein. Since the subject coating material is generally opaque to incoming translucent light passing through the solar cell, and would generally be opaque to any potential indirect light, typical reflective benefits for uncoated solar members would not be anticipated. However, here, the reflective advantages appear to result from reflecting at least one of the aforesaid Bremsstrahlung Radiation and/or other said scattering effects initiated by the special coating. Thus, providing a reflective provision behind the special coating material, such as a mylar sheet, a polished metal sheet, a mirror, a white or silver paint and/or a white or silver enamel final backing application, a reflective type paint, or the like, not only enhances the efficiency of the special coating, but affords protective purposes to enhance the durability and lifespan of the primary special coating itself.

A method of adjusting high-energy light waves/photons (such as those with a wavelength greater than about 1,100 nanometers) into lower-energy light waves, and/or of adjusting high-energy electrons (with eVs above 3.5) into lower energy electrons, so that electrons can be transitioned into the conduction band of a solar cell, and/or that can adjust low-energy light waves/photons (such as those with a wavelength less than about 350 nanometers) into higher-energy light waves, and/or of adjusting low-energy electrons (with less than 1.1 eV, as an example) to gain extra energy so as to transition into the conduction band of a solar cell, would be where such adjustment is caused by reflecting such high-energy and/or low-energy light waves and/or electrons off of at least one of the coatings disclosed herein, with the coating material comprising at least one of, in crushed or powdered form, obsidian, salt, sea salt, silicon dioxide, limestone, granite, cement, quartz, white quartz, light colored sand, a prism material, diamond, phosphor, down-conversion crystals, up-conversion crystals, tin oxide, and glass, or the like (prism material, down-conversion crystals, and up-conversion crystals are well understood by those skilled in the art, as are all of the other named elements/materials), with an optional and preferable reflective surface placed behind the coating material. Such a method, utilizing one of a coating as disclosed herein, which coating may include at least one of the above-named materials, and which coating is positioned behind, and/or below, and/or near a solar member, together with an optional reflective surface situated behind such a coating, which coating may include at least one of the above-named materials, and which coating is placed behind and/or near a solar member, which method acts to increase electrical production percentages as solar irradiance decreases in both directly coated solar members and in nearby (nearby defined herein as being within about a six meter radius) uncoated solar members, is herein referred to as the "Ryland Method" and/or as the "Ryland Effect' of increasing the electrical production from any type of solar member, as the method was discovered and developed by B. Ryland Wiggs.

The Ryland Effect extends both to a coated solar member and around a coated solar member to other nearby uncoated solar members in what is hereby called "halo" fashion/manner/effect. Such a "halo effect" extends beside, behind, in front of, and/or near ("near" herein meaning and defined as being within at least about a six-meter radius) coated solar members. Consequently, in solar fields/arrays where there are typically multiple rows of solar modules/solar panels, with the rows typically spaced within six feet, or less, of each other, coating every solar module/solar panel is unnecessary, thereby significantly saving coating costs when utilizing at least one of the coatings disclosed herein. Further, due to one of the Ryland Effect and/or the halo effect, the coating can be utilized as a pavement and/or coating placed on the ground below solar fields/arrays, or placed in, or on, rooftops below any roof-top solar arrays, which utilization and placement is not shown herein, as same would be well understood by those skilled in the art and by most everyone. While the Ryland Method/Ryland Effect was discovered and developed by B. Ryland Wiggs, David R. Wiggs developed the idea of placing at least one round surface, covered with at least one of the coatings disclosed herein, within a solar field/array.

As a result of at least one of the "Ryland Effect/Ryland effect" and the "halo effect", at least one of the coatings disclosed herein can at least one of utilize, reflect, and produce electro-magnetic wavelengths of sizes at least between two hundred nanometers and one hundred meters. As is well understood by those skilled in the art, typical silicon solar members generally utilize electro-magnetic and/or light wavelengths in the range of about 350 nanometers (nm) to 1,100 nm to produce electricity. However, with at least one of the coatings disclosed herein, solar members, whether primarily comprised of silicon, cadmium telluride, or other composition, can at least one of utilize, reflect, and produce electro-magnetic wavelengths of sizes at least between 200 nm and 100 meters, which positively expands the useful wavelengths sizes for solar members, resulting in increased efficiency/electrical production output.

As a result of the new coating's presently identified halo effect, there are several preferred methods of coating (herein meaning providing at least one of the coatings disclosed herein) solar members in a field/array of solar cell panels/solar cell modules, as follows:

A. Applying at least one of the coatings disclosed herein to every other panel/module in a middle coated row, and applying least one of the coatings disclosed herein to every other panel/module in the row in front of and behind the middle coated row, but with the coated modules in front of and behind the middle row being staggered so that the coated panels/modules are both in front of and behind the uncoated panels/modules in the middle row; and consecutively for the rest of the solar field/array.

B. Applying at least one of the coatings disclosed herein to every third panel/module in a middle coated row, and applying least one of the coatings disclosed herein to every third panel/module in the row in front of and behind the middle coated row, but with the coated panels/modules in front of and behind the middle row being staggered so that the coated panels/modules are respectively in front of and behind the uncoated panels/modules in the middle row; and consecutively for the rest of the solar field/array.

C. Applying at least one of the coatings disclosed herein to every other panel/module in a first coated row; with the row in front and the row behind the one first coated row having every third panel/module coated, and with the coated panels/modules staggered so as to alternately be one of in front of and behind an uncoated panel/module to the extent possible; and consecutively for the rest of the solar field.

D. Applying at least one of the coatings disclosed herein to the panels/modules located on the far-left end and on the far-right end of each respective row of panels/modules in a solar field/array. Rows of modules, as well as solar fields/solar arrays of solar modules are well understood by those skilled in the art.

In light of all the above, new and preferred methods of increasing the electrical output of solar members, and of additionally affording some potential cooling benefit to solar members, comprise utilizing what is herein defined and disclosed as a "coating(s)", together with an optional but preferred reflective backing material and/or reflective coating (except when the coating is placed between bi-facial solar members, which have solar cells on both the front and back sides of a solar panel/solar module, as is well understood by those skilled in the art), which backing material is herein named a "reflective material" and is placed in back of the coating, which reflective material and/or coating is comprised of at least one of an outdoor/exterior rated white and/or silver liquid paint, an outdoor rated white and/or silver liquid enamel, an outdoor/exterior rated reflective liquid paint, or the like, a white sand surface, a biaxially-oriented polyethylene terephthalate (mylar) surface, a polished metal surface, a glass mirror surface, or the like, as well as where an optional additionally added 10% to the quantity of any such named liquid reflective coating utilized is comprised of at least one of sea salt, powdered glass, crushed and/or powdered quartz, crushed and/or powdered white quartz, and one of light-colored sand. All of the above-named components and/or materials are well understood by those skilled in the art. "Light-colored" is herein defined as a color between pure white (100%) and pure black (0%), which may include a grayish and/or yellowish tint and/or shade of color, where, on the scale between "0" and "100", a light color would be at least 51%.

The "coatings" disclosed herein may be comprised of a first component comprised of solid form elements, which may be directly applied to the back of solar members with a covering, or the like, holding the solid form elements in place. Optionally, the first component may be mixed with a second component comprised of at least one of a liquid and a wet/moist glue liquid so as to form a paste-like substance that, before drying can be easily applied to, and stick to, the back of a solar member and/or to the front of a separate (preferably solid or substantially solid) surface situated behind and/or near a solar member.

Further, a reflective material, comprised of a solid material, such as mylar, a polished metal, a mirror, or the like, or comprised of a white or silver liquid paint, a white or silver liquid enamel, a reflective liquid paint, or the like, may optionally be applied behind the first component of the coating, or behind the first component when mixed with the second component of the coating after the mixture has dried.

Also, an optional additionally added 10% of solid particulates may be added to the quantity of any such named liquid reflective material utilized, which optional additional 10% is comprised of at least one of sea salt, powdered glass, crushed and/or powdered quartz, crushed and/or powdered white quartz, and one of light-colored sand.

All such elements and/or materials and/or liquids named hereinabove in the first component, in the second optional component, and in the additional optional 10% of solid particulates added to the second optional component, must be, and are herein defined as being, at least 80% pure; where all percentages are percentages based on volume unless otherwise specified; and where all stated percentages of are within 10%, plus or minus, of the percentages named and identified unless otherwise stated.

Both Silicon Dioxide/sand and cement are well understood by those skilled in the art. Adding a cement increases the strength of the coating material(s) and provides an adhesive quality to the sand in the coating. For clarification, as used herein, the term "cement" includes what are commonly known as "traditional cement types" such as Quikrete® and/or Portland Cement, and/or Portland Cement I-II, and/or Portland Cement 1-L, and/or Sakrete, or the like, all of which traditional cement types typically come in a powdered particulate form. In order to form a paste which can be attached to the back of a solar member or to a separate solid material, before it cures and hardens, the powdered cement needs to be mixed with a liquid, such as water, or the like, as is all well understood by those skilled in the art. Also, wet/moist mixtures, such as glues, super-glues, epoxies, and the like, which would also all be well understood by those skilled in the art, and which are all collectively herein referred to as "glues", may optionally be utilized alone and/or in conjunction with a cement to mix with the coating material so as to enable at least one of the coatings disclosed herein to be applied to, and to stick to, the back of at least one of a solar member and a separate solid surface when still in a wet form, before the coating and cement and/or glue mixture dries. All of the above-named components and/or materials are well understood by those skilled in the art.

Additionally, as used herein, the term "cement" includes the optional use of "cement curing retardants or cement curing accelerators for traditional cements", which are well understood by those skilled in the art. Due to varying hot or cold outdoor weather conditions, when a traditional powdered cement is used in conjunction with one of the mixtures disclosed herein, adding either a cement curing retardant or a cement curing accelerator would be optional, as would be well understood by those skilled in the art. As an example, traditional cement curing accelerators are reported to typically be comprised of organic retarders, such as phosphonates, lignosulphonates, sugars, hydroxycarboxylic acids, or the like, and/or of inorganic retarders, such as salts of Pb, Zn, Cu, As, Sb, borates, phosphonates, or the like. All of the above-named components and/or materials are well understood by those skilled in the art.

As previously referenced, for clarification, the word/term "near" is herein defined as being within a six-meter distance unless otherwise clearly stated.

1. The preferred method disclosed herein of increasing the electrical output of solar members, and of additionally affording some potential cooling benefit for solar members include the provision of a first component and an optional second component, as more fully hereinafter disclosed.

The first component is comprised of a particulate in crushed or powdered form, which first component may be placed behind a solar member and secured in place by a tight covering, such as a plastic covering, or the like. When preferred, no more than an optional 10% of Silicon Carbide can be added to the first component to assist in solar member cooling abilities.

The second optional component is comprised of at least one of a liquid and/or of a wet/moist glue, such as a liquid glue, a liquid super-glue, a wet/moist epoxy, or the like. So that when mixed with the first component, a paste is formed that can be applied to at least one of a solar member and a separate solid surface when still in a wet/moist form, before the mixed first component and second component mixture cures and dries.

By mixing the first and second components together, a sticky paste is formed that can be applied to the back of a solar member that has already been installed in a solar field/solar array, without having to remove, or to even interrupt the operation of, the solar member, which is highly advantageous from a coating application time and cost aspect, as well as enabling continuous electrical production value from installed and operating solar members.

At least one of the first component and the mixed first component and second component can also optionally be incorporated into the actual composition of the back-sheet of a solar member, which could easily be done in the solar member manufacturing process, and which would avoid the need to place the coating on the back side of a solar member.

However, when applying the coating to existing pre-manufactured solar members and/or to a solid separate surface, which solid separate surface would be positioned behind and/or near to (within six meters) a solar member, one would typically and preferably mix the first component with the second component, with the mixture preferably comprising between 35% and 65% of the first component, and between 65% and 35% of the second component. This mixture ratio will result in a sticky "paste" type substance with a consistency that can be easily applied to, and stick to, the back of a solar member and/or to the front of a solid separate surface, even when the solar member and/or the solid separate surface is totally upside down. Such a paste consistency facilitates the coating application speed and lowers the application cost.

Alternately, as an example, while the coating could optionally be applied via initially applying the second liquid and/or wet/moist glue component to the surface of the back-sheet of a solar member lying front clear glass face down, with its back-sheet facing upwardly, and then next applying the first component, which would seep into the initially applied first component itself, and or with the assistance of some additional water being sprayed on, it is more efficient to mix the first component with the second component and then apply the paste-like mixture to the back of a solar member, in whatever position the solar member is.

For additional clarification, the "coating" may comprise a first component and, optionally, a second component mixed with the first component to form a paste. The first component may comprise (a) one or more materials in a solid particulate form that is one of crushed and powdered. The second component may comprise one or more liquids or one or more wet/moist glues/epoxies. Also disclosed herein is a reflective material that may optionally be disposed behind the first component of the coating on the solar member and/or on the surface of the substrate. If the reflective material is also disposed on the solar member, the coating may be disposed between the solar member and the reflective material, with the coating being directly adjacent to the solar member and with the reflective material being disposed behind the coating, If the reflective material is disposed on the surface of the substrate, the reflective material may be disposed between (a) the coating (on the solar member) and (b) the surface of the substrate, with the surface of the coating facing the solar member. To form the reflective material, one or more solid materials and a liquid may be mixed together. In an embodiment, the resulting mixture may be applied on and behind the one or more coatings disposed on the solar member. In another embodiment, the reflective material may be applied to the surface of the substrate, with the reflective material being disposed behind the coating so that any reflected electromagnetic radiations, or the like, is primarily directed via reflection into the solar member.

In yet another embodiment, the reflective material may be applied on both the one or more coatings disposed on the solar member, and on the surface of the substrate, with the reflective material always being behind the coatings so that any reflected electromagnetic radiations, or the like, is primarily directed via reflection into the solar member.

In some embodiments, the reflective material may be in the form of a liquid or paste when applied and subsequently forms a dry layer when the moisture evaporates from the liquid or paste.

When discussing the specific composition of coatings, elements disclosed are at least 80% pure; where all percentages are percentages based on volume unless otherwise specified; and where all stated percentages of are within 10%, plus or minus, of the percentages named and identified unless otherwise stated.

2. The method described above, in method 1, where all of the above-named liquid components in the second component, which are all well understood by those skilled in the art, are water-based liquid components. Water-based materials are preferred, as they are positive from an environmental and/or material safety perspective.

3. The method described above in method 1, where all coatings of the first component and of the second optional component, with or without optional reflective materials, are covered with one of a final last protective covering, comprised of a plastic, a metal, a glass, a plexiglass, a board, a composite material, a foam material, or the like. This affords an even more weather resistant backing for coated modules if desired.

4. The method described above in method 1, where all solid particulate components in the first component and optionally in the second optional component, are comprised of component particulate sizes of a twenty mesh/841 micron, or smaller, particulate size, and where any sand utilized in the coatings, regardless of the type of sand, has no more than a 1.4 angularity, and has fineness modulus of no more than 3.7, and where the all the coatings, when applied on to and/or within the back-sheet of a solar member, and/or when applied on to and/or within a separate solid surface, have an applied, cured, and dried thickness that is not greater than five millimeters (one-half centimeter).

Mesh sizes, angularity, fineness modulus, and millimeter sizes are all well understood by those skilled in the art. Such disclosed angularity and fineness and mesh types of the coating components disclosed herein facilitate both the "Ryland effect" and/or the "halo effect", as well as affording ease of application when coatings are applied by at least one of hand-application and spray-on application, or the like, and helps to avoid clogging in spray supply lines during optional spray-on applications. Increasing the thickness of the special coating beyond five millimeters does not provide an overall efficiency/electrical production increase advantage and is more costly.

5. Also disclosed is a method of increasing the electrical output from solar members by at least one of applying at least one of the coatings disclosed above at least one of onto and within the back-sheet material of a solar member, and by applying at least one of the coatings disclosed in the method disclosed above at least one of onto and within a separate solid surface, which solid surface is at least twenty-five percent the size of the individual solar members in the solar array; and which solid surface is positioned behind and/or below and/or near solar members; and which separate solid surface, if comprised of aluminum, or the like, is first coated with a non-corrosive outdoor rated paint, enamel, or the like, when a cement coating is applied; and which separate solid surface may be one of flat, angled, V-shaped, concave shaped, circular, semi-circular, square shaped, rounded, dome-shaped, or the like; and where when the coating is applied onto a solid separate surface positioned behind the solar member, the coating is applied in a reverse order from that of when being applied directly to a solar member, as identified in the method disclosed herein above so that any optional reflective material is first applied to the solid separate surface, which reflective material is next followed by applying the coating material itself.

The subject coating of the first component and of the second optional component, as disclosed herein, may optionally be integrated into the actual back-sheet of a solar member itself and/or may optionally be integrated into an actual separate solid surface itself, particularly in a manufacturing process to save coating time in the field.

Applying at least one of the coatings of the first component and of the second optional component to a separate solid surface, such as a board, or the like, eliminates the time necessary to apply the coating in the field, affords the advantage of off-site preparation/manufacturing, and eliminates solar member original manufacturer warranty violation concerns, as such a coated board, or the like, can be easily attached to a solar member's back support frame, without touching, or otherwise altering, the solar member itself. If a cement is included as an optional element of the first component disclosed herein, it is necessary to first coat any aluminum, or the like, to which the first component is applied, with a non-corrosive outdoor rated paint, enamel, or the like, so as to prevent any adverse chemical reaction between the cement and the aluminum, or the like.

As examples of various separate solid surface configurations, drawings of a coated flat surface, a coated rounded surface, and a coated dome-shaped surface are shown in FIGS. 5, 6, and 7. Additionally, the staggered placement of coated surfaces within a solar field/array, whether or not among other nearby solar panels/solar modules that are already coated as disclosed herein, can facilitate and even further improve the electrical output ability of solar members that are already coated themselves.

6. According to the methods disclosed above, the electrical circuitry of coated solar members may preferably be increased from standard circuitry design sizing so as to accommodate the increased electrical output provided by the special coating, and where inverters are set to activate when solar irradiance levels are at a seventy solar irradiance level, or less.

Most solar members and inverters can handle the efficiency/electrical output increases afforded by the special coatings disclosed herein, as they are commonly designed to handle around 10% or more, electrical output increases at high solar irradiance levels of around 1,000 to 1,200 solar irradiance levels, so as to accommodate periodic solar irradiance/sun radiation spikes, electrical grid spikes, or the like. However, if any solar member design does not afford at least an approximate 10% over-electrical production capacity safeguard for such said high solar irradiance conditions, the electrical circuitry of the solar member should be increased so as to accommodate the previously unknown and unanticipated increased electrical output provided by the special coatings disclosed herein during such said high solar irradiance conditions. Such an increased electrical circuitry design is not shown in any drawings herein, as same would be well understood by those skilled in the art.

Further, most inverters, especially on large solar arrays, are set/designed to stop working when solar irradiance levels reach a low solar irradiance level of about 100, as most solar members do not produce enough electrical current for inverters to be cost-effective to operate when solar irradiance levels fall to, or below, a 100 level, which is well understood by those skilled in the art. However, when at least one of the coatings disclosed herein is applied to solar members, their electrical output is significantly increased, by around 40% or more, during low solar irradiance conditions. With such a low solar irradiance electrical output increase, inverters can be operationally cost-effective when solar irradiance levels are at a 70, or lesser, solar irradiance level.

7. According to the methods disclosed above, at least one of the backing material, the back-sheet, any/all hard, solid, protective coverings on the back of solar panels/solar modules, and any separate solid surfaces where any of the coating disclosed herein have been incorporated into and/or applied to, may preferably be comprised of one of an acrylonitrile butadiene styrene, and a BoPET (Biaxially-oriented polyethylene terephthalate), and an acrylonitrile butadiene styrene (ABS), or the like.

Various types of back-sheets, and the like, are utilized by varying solar member manufacturers, as is well understood by those skilled in the art. However, such a BoPET and/or ABS material, or the like, uniquely facilitates and enhances the positive efficiency/electrical output increases afforded by the coatings disclosed herein.

8. Also disclosed is a method of cooling solar members by applying at least one of the coatings disclosed above to at least one of the back side and/or back-sheet of solar members, and a solid, separate, surface, where the coating cools the solar cells/solar panels/solar modules by means of releasing heat radiation in wavelengths between six and fifteen micrometers.

Such wavelengths increase the likelihood of minimizing heat radiation bounce-back from the atmosphere, thereby increasing the likelihood of sending the heat out and away into deep space. U.S. Pat. No. 10,655,923 to Wiggs disclosed a method of cooling via applying a coating that released heat radiation in wavelengths between 7.9 and 13 micrometers. However, at least one of the coatings disclosed herein affords an expansion of the micrometer range for useful heat radiation elimination from coated objects, inclusive of solar members, which increases heat rejection opportunities and efficiencies.

9. Also disclosed is a method of cooling a solar member and/or of cooling a solar member which has been coated with a coating disclosed herein, where an evaporative cooling means is effected by applying a cooling material to the back-sheet of solar cells/solar panels/solar modules and/or to the extreme back of coated solar cells/solar panels/solar modules, where the evaporative cooling material is comprised of a thermo-responsive water absorption and/or water adsorption and water desorption material, such as a thermo-responsive polymer and a hydrophilic component and/or sodium alginate, or the like, that absorbs/adsorbs rain and/or fog and/or water mist and/or water vapor and/or any form of water from the air when the temperature of the special material is twenty-five degrees Celsius (C), or less, and that desorbs and/or evaporates water into the air when the temperature of the special material is at any preferred temperature level that is above twenty-five degrees Celsius and less than sixty degrees Celsius.

It is well known that water can be applied to solar members for cooling purposes. However, directly applying water is expensive and can consume a large amount of water in areas where water supplies are scarce. Consequently, applying such a cooling method advantageously accomplishes cooling and efficiency advantages, particularly in hot weather when most advantageous, via evaporative cooling without needing or depleting natural water supplies in the areas of any solar fields/arrays.

10. A method of increasing the electrical output of solar members, where at least one of a solar energy and/or light energy and/or electron energy down-conversion and/or up-conversion and/or scattering coating, is applied to and/or within at least one of the back of a solar member; and/or to the back-sheet of a solar member; and/or to a separate surface, such as a board, or the like, and which separate surface is positioned within six meters of the solar member, so that at least one of solar energy, photons, artificial light, and electrons is/are reflected, elastically and/or inelastically, off at least one of the said down-conversion and/or up-conversion and/or scattering coating and then into solar members of any material type within at least a six meter radius, and where the coating is optionally separately applied to and/or on and/or within at least one of a pavement, the ground, and a rooftop below any solar field/array, so that at least one of reflected solar energy, reflected photons, reflected artificial light, and reflected electrons have an energy level that will enable electrons to be transitioned into the conduction band of the solar members comprised of most any material type, and where at least one of a solar energy and/or light energy and/or electron energy down-conversion and/or up-conversion and/or scattering coating is comprised of at least one of the special coatings disclosed herein above.

The above method is made viable via at least one of the "Ryland effect" and/or the "halo effect", as previously explained hereinabove.

11. A method to increase the electrical output of a solar member by means of applying a coating mixture and/or material to the back of, and/or near, the solar member, which coating is comprised of any material which results in at least one of additional photons and/or electrons traveling into the solar member by means of at least one of modification and/or reflection and/or scattering from at least one of the Bremsstrahlung Radiation effect and/or from effects including, but not limited to, Raman scattering, Stokes Raman scattering, anti-Stokes Raman scattering, Compton scattering, Thompson scattering, Brillouin scattering, Debye or Mie Scattering, Rayleigh scattering, or the like, and which coating may be comprised of at least one of the coatings disclosed herein.

Solar members typically rely on direct and/or indirect light, entering through the front side of the solar member to produce electricity, as is well understood by those skilled in the art. However, applying at least one of the coatings disclosed herein on the back of and/or near solar members, such as at least one of the coatings disclosed herein, that results in at least one of an electro-magnetic radiation and/or light wavelength/energy level modification and/or reflection and/or scattering and/or an electron energy level modification, via at least one of the above-said effects, produces additional and advantageous electrical output in at least one of coated and nearby uncoated solar members, which advantageous electrical output is over and above that of the electrical output produced by light and/or indirect light entering through the front of solar members alone. The said coating results are also positively effective on any additional light that is simply reflected into a solar member by means of mirrors, or the like. The application of such a material mixture/material to and/or near the back of solar members, that effects and utilizes such a novel process/method to produce additional electricity in solar members, is herein called the "Ryland effect".

12. A method of increasing the electrical output of a solar member by means providing any coating that acts to increase the electrical output to the solar irradiance ratio as solar irradiance levels decrease, which advantageous method is attained by means of applying at least one of the coatings disclosed herein to solar cells/solar panels/solar modules (collectively herein referred to and defined as "solar members" unless otherwise specified in more detail).

While at least one of the coatings disclosed herein will act to increase the electrical output of solar members to the solar irradiance ratio as solar irradiance levels decrease, this is the opposite of what happens with traditional solar members, as would be well understood by those skilled in the art, and is therefore an extremely unique and traditionally unanticipated design advantage of the coatings disclosed herein. This unique coating design advantage affords increased electrical output, especially during mornings, evenings, and periods of cloudy/rainy weather when traditional uncoated solar members do not efficiently perform, which is why inverters in traditional uncoated solar fields/arrays are generally set to disengage when solar irradiance levels are at 100, or less. This unique coating design advantage enables inverters in traditional uncoated solar fields/arrays are generally set to disengage when solar irradiance levels are at 70, or less, which is financially advantageous.

13. A method of increasing the electrical output of solar members by means of applying at least one of the coating disclosed herein to alternating coated and uncoated solar members in a staggered manner throughout a solar field/array, such as: applying the coating to at least one of every other solar member within a row of solar members; and/or applying the coating to every third solar member within a row of solar members; and/or applying the coating to alternating rows of every other solar member coated and every third solar member coated; and in any other preferred staggered solar member coating application manner, where at there is at least one coated solar member coated at least within a six meter radius of any uncoated solar member within a solar field/array.

Sparse, staggered placement arrangements, of coated solar members within a solar field/array may be made as preferred, based upon preferred coating time and cost factors in any particular situation, as positive coating effects spread over time, and can be attained, within a period of about sixty to ninety days, on uncoated solar members that are at least within six meters of coated solar panels/solar modules within a solar field/array. Examples of three staggered placement arrangements of coated solar panels/solar modules within a solar field/array are shown herein in FIGS. 8, 9, and 10. However, other staggered, and even more sparse, coated solar member arrangements can optionally be made as preferred in any particular situation, typically based upon coating cost factors, but with overall solar field/array electrical outputs decreasing as the sparsity of coated solar members increases. Further, the staggered placement of coated solar members within a solar field/array, whether or not among other nearby solar members that are already coated as disclosed herein, can facilitate and improve the electrical output of such solar members that are already coated themselves.

15. A method of increasing the electrical output of a bifacial solar cell module, where at least one of the coatings disclosed herein, without any reflective backings, is applied/provided between the two respective first and second solar cell sets which comprise the coated bifacial solar cell solar module, where the first solar cell set is in a first direction toward the sun, and where the second solar cell set faces in a second direction different than the first direction.

Bifacial solar modules are well understood by those skilled in the art. Since a reflective material would be opaque, no reflective material would be utilized when the coating is preferably placed between the two common respective sets of solar cells in a bifacial solar module. While a separate coated solid surface can be placed within one foot or so of a bifacial solar module and significantly increase its electrical output, as light would be able to enter through the separation distance and still get into the second set of solar cells, it is most efficient to place the coating between the first and second solar cell set, without any reflective backing, which reflective backing could block some translucent light and/or other positive scattering effect from entering the first and/or the second solar cell set and thereby impair the overall positive coating effect on the bifacial solar module.

There have been various potentially related prior art matters that have been located, which are cited and distinguished from the subject disclosures as noted below:

"A Method of Producing Low-Density, High-Strength Thin Cement Sheets: Pilot Run for a Glass-Free Solar Panel" was developed by Jyh-Jeng Deng, et al. See Materials 2023, 16, 7500.https://doi.org/10.3390/ma16237500. However, this invention, as well as other inventions cited therein, had the purpose of providing a strong, but lightweight, cement sheet to replace heavier glass utilized on the back of some solar modules/solar panels. The said invention's purpose was stated to increase the efficiency of the solar module/solar panel installation process . . . not to increase the efficiency of the solar module/solar panel itself, as do the subject disclosures.

For example, the said invention was claimed to enable one man, instead of two men, to more easily install such lower-weight cement-backed solar cell modules/solar cell panels on rooftops by means of providing relatively thin, low density, high strength, cement back-sheets for supporting the entire solar module. Again, the said invention has zero claims or stated purpose of increasing the electrical output of solar modules/solar panels, as do the subject disclosures.

U.S. Pat. No. 8,764,207 B2 to Neff, discloses a parabolic formed trough with a reflective surface, where the trough structure is comprised of cement and a strong and light filler material, such as straw or other fibers. However, the purpose of the Neff invention is to provide a more cost-effective means to reflect light for solar power generation, and has no stated purpose of increasing the electrical output of solar modules/panels via means of scattering and/or light-wave modification and/or photon energy modification, or the like, as do the subject disclosures. As is well known, any means of reflecting additional useful energy level light into a solar module/solar panel will increase the electrical output, including further increasing the already enhanced electrical output of the subject disclosures. The subject Neff invention is simply an alleged improved means of reflecting more light into a solar module/panel. Further, the Neff invention places a reflective surface on top of the partially cement trough, and is solely intended to assist only one solar member. To the contrary, the protective/reflective surface disclosed herein may be behind the optionally partial cement mixture, and primarily serves to reflect and/or modify light and/or electron energy levels into energy levels that can be used to move additional electrons from valence bands into conduction bands, in both coated and nearby uncoated solar members.

U.S. Pat. No. 11,489,484 B2 to Chentnik, et al, discloses a solar ring/collar bifacial solar panel, comprised of an assembly that is wind-resistant, does not need pitch, azimuth, or bearing measurements, and that can be mounted on poles and/or other vertical structures, together with multiple means of reflecting light into the solar ring/collar bifacial solar panel. However, while Chentnik discloses a unique arrangement of known bifacial solar panels intended to capture direct and indirect sunlight without the need for a "sunflower" type moveable tracking system, Chentnik's disclosure does not benefit any nearby solar panels, whether any such nearby solar panels are bifacial solar panels or conventional solar panels with solar cells on only one side. Chentnik utilizes well-known methods of reflecting light into his solar ring/collar bifacial solar panel, and Chentnik's invention has no stated purpose of increasing the electrical output of solar modules/panels via means of scattering and/or light-wave modification and/or photon energy modification, or the like, as do the subject disclosures. While Chentnik's invention is beneficial in some respects, an improvement that benefits bifacial and/or other type solar panels by producing more electricity than simply by a well-known direct reflection of light into the front of a solar panel method, and that additionally increases the electrical output of other solar panels within a six, or greater, meter radius, whether or not the nearby other solar panels are coated as disclosed herein, is desired and preferable. Also, as previously mentioned, an increase of light entering into a solar member, via direct or indirect reflection only, would be of equal value to any solar member that had one of the disclosed special coatings herein applied, as the special coating would effectively proportionately increase the electrical output that the solar member obtained from the additionally added reflected light by about 10%, or more.

US 2013/0319502 A1 to Chawla, et al, discloses a solar cell (also known as a photovoltaic-cell, which is well understood by those skilled in the art) that is primarily bifacial, and that is comprised of multiple optional named/identified compositions, so as to convert light received from the top and/or from the bottom of the solar cell, as well as light received from reflection into the top and/or the bottom of the solar cell, into useful electricity.

Reflected light entering the Chawla solar cell designs, (from a stated mirrored surface, or from any other reflective material) is strictly referenced as a reflected light, via a clearly inferred simple elastic reflection. Chawla's light reflection from any of the materials described is not mentioned or claimed to change the wavelength of reflected light, or to change the energy level of disadvantageous reflected photons and/or electrons into energy levels favorable for solar member electrical production as do the subject disclosures).

It is well known and well understood by those skilled in the art that elastically reflected and/or elastically scattered light, when directed into the top and/or bottom of a bifacial solar cell, can increase the electrical power output by approximately 10% to 30%, depending on the amount of extra reflected light sent into the solar cell. However, such reflected light is limited to positively affect only the solar cell/module/panel into which it is directly reflected, and does not create any "halo" effect so as to positively affect adjacent solar cells/modules/panels into which the light is not directly reflected, as do the subject disclosures. The approximate 10% to 40%, or more, average electrical increase afforded by the coatings disclosed herein are in addition to any such 10% to 30% electrical power increase occasioned only by any such elastically reflected and/or elastically scattered light, and the herein disclosed coating's positive effect would only be proportionately increased by more light being elastically reflected into the bifacial solar panel, or into any other solar member type. Also, the subject disclosures herein place the reflective surface on the back side of the special components and/or mixtures disclosed herein, which special components and/or mixtures create the positive "halo" effect, and which special components and/or mixtures are opaque, and would therefore block most all useable light from even reaching Chawla's reflective surface.

US 2018/0339942 A1 to Hillard discloses a claimed composition of matter, including graphite, for use in fuel cells, thermal energy transfer, and for use as graphite electrodes that form a conducting and catalytic counter electrode for dye-sensitized solar cells. Thus, the Hillard claimed composition of matter is neither intended nor claimed to increase the electrical production form solar cells/modules/panels, as do the subject disclosures.

In one aspect of the present disclosure, a method of increasing electrical output of a solar member is disclosed. The solar member may comprise a solar cell, or a solar panel, or a solar module. The method may comprise: disposing a coating on one at least one of the back-side and the back-sheet of a solar member, and/or on a surface of a substrate positioned behind, below and/or near the solar member, wherein optionally the surface of the substrate is reflective. The coating may comprise a first component comprising: at least one of, in crushed and/or powdered form: obsidian, salt, sea salt, silicon dioxide, limestone, sandstone, granite, cement, quartz, white quartz, light colored sand, a prism material, diamond, phosphor, down-conversion crystals, up-conversion crystals, tin oxide, and glass. The first component may optionally further comprise no more than ten percent of Silicon Carbide. The coating may optionally further comprise a second component mixed with the first component to form a paste, the second component comprising at least one of a liquid and a wet/moist glue. The method may optionally further comprise: disposing a reflective material on the solar member and/or on the surface of the substrate, wherein when the reflective material is disposed on the solar member, the coating is disposed between (a) a back side or a back-sheet of the solar member and (b) the reflective material, and wherein, when the reflective material is disposed on the surface of the substrate, the reflective material is disposed between (c) the coating and (d) the surface of the substrate, wherein the surface is one of flat, angled, V-shaped, concave shaped, circular, semi-circular, square shaped, rounded, and dome-shaped, wherein, when the surface of the substrate is positioned behind the solar member, there is an air gap distance between the surface and the solar member of at least 1.59 mm to 6 m. In an embodiment, the reflective material may be comprised of at least one of (a) an outdoor/exterior rated liquid reflective paint, and/or outdoor/exterior rated liquid white paint, and/or outdoor/exterior rated silver liquid paint, (b) an outdoor rated liquid white and/or silver liquid enamel, and (c) a wet/moist glue, and wherein the reflective material, when a liquid, may optionally contain no more than 10% of a solid particulate comprised of at least one of sea salt, powdered glass, crushed and/or powdered quartz, crushed and/or powdered white quartz, and a light-colored sand. In an embodiment, the solar member may be in electrical communication via electrical circuitry with at least one inverter, the at least one inverter may be configured to activate when solar irradiance levels are at a seventy solar irradiance level, or less.

In another aspect of the present disclosure a method of increasing the electrical output from a solar member is disclosed. The solar member may comprise a solar cell, or a solar panel, or a solar module. The method may comprise: applying on and/or within a back-sheet material of the solar member, and/or applying on and/or within a separate surface of a substrate disposed at least one of behind, below, and near the solar member, at least one of, in crushed and/or powdered form, obsidian, salt, sea salt, silicon dioxide, limestone, sandstone, granite, cement, quartz, white quartz, light colored sand, a prism material, diamond, phosphor, down-conversion crystals, up-conversion crystals, tin oxide and glass; and optionally disposing a reflective material on the solar member and/or on the surface of the substrate, wherein when the reflective material is disposed on the solar member, the coating is disposed between (a) a back side or a back-sheet of the solar member and (b) the reflective material, and wherein, when the reflective material is disposed on the surface of the substrate, the reflective material is disposed between (c) the coating and (d) the surface of the substrate, wherein the surface is one of flat, angled, V-shaped, concave shaped, circular, semi-circular, square shaped, rounded, and dome-shaped. Optionally the surface of the substrate may be reflective. In an embodiment the surface may be at least one of flat, angled, V-shaped, concave shaped, circular, semi-circular, square shaped, rounded, and dome-shaped, and wherein, when the surface is positioned behind the solar member, there is an air gap distance between the surface and the solar member of at least 1.59 mm to 6 m. In an embodiment, the at least one of a back-side and a back sheet may be comprised of at least one of an acrylonitrile butadiene styrene, and a BoPET (Biaxially-oriented polyethylene terephthalate), and an acrylonitrile butadiene styrene (ABS).

In another aspect of the present disclosure, a method of cooling a solar member is disclosed. The solar member comprising a solar cell, or a solar panel, or a solar module. The method may comprise: applying an evaporative cooling material to at least one of the back-side and the back-sheet of a solar member and to the exterior back side of a solar member on which a coating is disposed, wherein the evaporative cooling material may comprise a thermo-responsive water absorption and/or water adsorption and water desorption material, that absorbs/adsorbs rain and/or fog and/or water mist and/or water vapor and/or any form of water from the air when the temperature of the evaporative cooling material is twenty-five degrees Celsius (C), or less, and that desorbs and/or evaporates water into the air when the temperature of the evaporative cooling material is above twenty-five degrees Celsius and less than sixty degrees Celsius.

In another aspect of the present disclosure, a method of cooling a solar member is disclosed. The solar member comprising a solar cell, or a solar panel, or a solar module. The method comprising: applying a coating to the back-side and/or to the back-sheet of a solar member or to a surface of a substrate disposed behind, below and/or near the solar member, wherein the coating is adapted to release heat radiation in wavelengths of six to fifteen micrometers. In an embodiment, wherein the coating is disposed on one at least one of the back-side and the back-sheet of a solar member, and/or on a surface of a substrate positioned behind, below and/or near the solar member, wherein optionally the surface of the substrate is reflective, the coating may comprise a first component and optionally, a second component mixed with the first component to form a paste. The first component may comprise at least one of, in crushed and/or powdered form: obsidian, salt, sea salt, silicon dioxide, limestone, sandstone, granite, cement, quartz, white quartz, light colored sand, a prism material, diamond, phosphor, down-conversion crystals, up-conversion crystals, tin oxide, and glass; and optionally, no more than ten percent of Silicon Carbide. The second component may comprise at least one of a liquid and a wet/moist glue. The method may further comprise optionally disposing a reflective material on the solar member and/or on the surface of the substrate, wherein when the reflective material is disposed on the solar member, the coating is disposed between (a) a back side or a back-sheet of the solar member and (b) the reflective material, wherein, when the reflective material is disposed on the surface of the substrate, the reflective material is disposed between (c) the coating and (d) the surface of the substrate, wherein the surface is one of flat, angled, V-shaped, concave shaped, circular, semi-circular, square shaped, rounded, and dome-shaped. When the surface of the substrate is positioned behind the solar member, there may be an air gap distance between the surface and the solar member of at least 1.59 mm to 6 m.

In another aspect of the present disclosure, a method of increasing the electrical output of a solar member is disclosed. The solar member may comprise a solar cell, or a solar panel, or a solar module. The method may comprise: applying at least one of a solar energy and/or light energy and/or electron energy down-conversion and/or up-conversion and/or scattering coating to and/or within at least one of (a) a back of a solar member; and/or (b) to and/or within a surface of a substrate that is positioned 1.59 mm to six meters of the solar member, wherein the coating adapted to reflect at least one of solar energy, photons, artificial light, and electrons at energy levels that enables electrons to be transitioned into the conduction band of solar members, wherein the coating adapted to reflect, elastically and/or inelastically, at least one of solar energy, photons, artificial light, and electrons into any other solar member disposed within at least a six-meter radius. The method may further comprise optionally, applying the coating to and/or on and/or within at least one of a pavement, the ground, and a rooftop below a solar field/array.

In an embodiment, wherein the coating is disposed on one at least one of the back-side and the back-sheet of a solar member, and/or on a surface of a substrate positioned behind, below and/or near the solar member, wherein optionally the surface of the substrate is reflective, the coating may comprise a first component and optionally, a second component mixed with the first component to form a paste. The first component may comprise at least one of, in crushed and/or powdered form: obsidian, salt, sea salt, silicon dioxide, limestone, sandstone, granite, cement, quartz, white quartz, light colored sand, a prism material, diamond, phosphor, down-conversion crystals, up-conversion crystals, tin oxide, and glass; and optionally, no more than ten percent of Silicon Carbide. The second component may comprise at least one of a liquid and a wet/moist glue. The method may further comprise optionally disposing a reflective material on the solar member and/or on the surface of the substrate, wherein when the reflective material is disposed on the solar member, the coating is disposed between (a) a back side or a back-sheet of the solar member and (b) the reflective material, wherein, when the reflective material is disposed on the surface of the substrate, the reflective material is disposed between (c) the coating and (d) the surface of the substrate, wherein the surface is one of flat, angled, V-shaped, concave shaped, circular, semi-circular, square shaped, rounded, and dome-shaped. When the surface of the substrate is positioned behind the solar member, there may be an air gap distance between the surface and the solar member of at least 1.59 mm to 6 m.

In another aspect of the present disclosure, a method of increasing the electrical output of a solar member. The solar member may comprise a solar cell, or a solar panel, or a solar module. The method may comprise: applying a coating and/or material to the back of a solar member, and/or on a surface of a substrate disposed near the solar member, wherein coating and/or material is adapted to provide at least one of additional photons and/or electrons traveling into the solar member by at least one of modification and/or reflection and/or scattering from at least one of (a) a Bremsstrahlung Radiation effect and/or (b) a Raman scattering, (c) a Stokes Raman scattering, (d) an anti-Stokes Raman scattering, (e) a Compton scattering, (f) a Thompson scattering, (g)

a Brillouin scattering, (h) Debye or Mie Scattering, and (i) Rayleigh scattering. In an embodiment, wherein a coating is disposed on one at least one of the back-side and the back-sheet of a solar member, and/or on a front surface of a substrate positioned behind, below and/or near the solar member, and wherein optionally the surface of the substrate is reflective. The coating comprises: a first component and optionally, a second component mixed with the first component to form a paste. The first component may comprise at least one of, in crushed and/or powdered form: obsidian, salt, sea salt, silicon dioxide, limestone, sandstone, granite, cement, quartz, white quartz, light colored sand, a prism material, diamond, phosphor, down-conversion crystals, up-conversion crystals, tin oxide, and glass; and optionally, no more than ten percent of Silicon Carbide. The second component may comprise at least one of a liquid and a wet/moist glue. The method may further comprise optionally disposing a reflective material on the solar member and/or on the surface of the substrate, wherein when the reflective material is disposed on the solar member, the coating is disposed between (a) a back side or a back-sheet of the solar member and (b) the reflective material, wherein, when the reflective material is disposed on the surface of the substrate, the reflective material is disposed between (c) the coating and (d) the surface of the substrate, wherein the surface is one of flat, angled, V-shaped, concave shaped, circular, semi-circular, square shaped, rounded, and dome-shaped. The surface of the substrate may be positioned behind the solar member, wherein there may be an air gap distance between the surface and the solar member of at least 1.59 mm to 6 meters (m).

In another aspect of the present disclosure, a method of increasing the electrical output of a plurality of solar members is disclosed. The solar member may comprise a solar cell, or a solar panel, or a solar module. The method may comprise: applying a coating to at least some of the plurality of solar members in a staggered manner throughout a solar field that comprises the solar members or throughout an array that comprises the solar members; or applying the coating to at least one of every other solar member within a row of solar members; or applying the coating to at least every third solar member within a row of solar members; or applying the coating to alternating rows of solar members, wherein every other solar member is coated and where every third solar member is coated; or wherein there is at least one coated solar member within at least a six-meter radius of any uncoated solar members within a solar field/array. In an embodiment, there may be a coated solar member at each end of each row in the solar field/solar array.

In another aspect of the present disclosure, a method of increasing the electrical output of a bifacial solar cell module that comprises first and second sets of solar cells is disclosed. The method may comprise: disposing a coating between the two respective first and second sets of solar cells of the a bifacial solar module, which first set of solar cells comprise a front part of the coated bifacial solar module, wherein the first set of solar cells face in a first direction toward the sun, and wherein the second set of solar cells comprise a back part of the coated bifacial solar module, wherein the second set of solar cells face in a second direction different than the first direction. Wherein the coating may comprise a first component and optionally, a second component mixed with the first component to form a paste. The first component comprising: at least one of, in crushed and/or powdered form: obsidian, salt, sea salt, silicon dioxide, limestone, sandstone, granite, cement, quartz, white quartz, light colored sand, a prism material, diamond, phosphor, down-conversion crystals, up-conversion crystals, tin oxide, and glass; and optionally, no more than ten percent of Silicon Carbide. The second component may comprise at least one of a liquid and a wet/moist glue.

In another aspect of the present disclosure, a method of increasing electrical output of a solar member is disclosed. The solar member may comprise a solar cell, or a solar panel, or a solar module. The method may comprise applying a coating to the solar member, the coating adapted to increase an electrical output to the solar irradiance ratio as solar irradiance levels decrease. In an embodiment, the coating may comprise: a first component and optionally, a second component mixed with the first component to form a paste. The first component may comprise: at least one of, in crushed and/or powdered form: obsidian, salt, sea salt, silicon dioxide, limestone, sandstone, granite, cement, quartz, white quartz, light colored sand, a prism material, diamond, phosphor, down-conversion crystals, up-conversion crystals, tin oxide, and glass; and optionally, no more than ten percent of Silicon Carbide. The second component may comprise at least one of a liquid and a wet/moist glue. The method may further comprise: optionally disposing a reflective material on the solar member and/or on the surface of the substrate, wherein optionally the surface of the substrate is reflective, wherein when the reflective material is disposed on the solar member, the coating is disposed between (a) a back side or a back-sheet of the solar member and (b) the reflective material, wherein, when the reflective material is disposed on the surface of the substrate, the reflective material is disposed between (c) the coating and (d) the surface of the substrate, wherein the surface is one of flat, angled, V-shaped, concave shaped, circular, semi-circular, square shaped, rounded, and dome-shaped, wherein, when the surface of the substrate is positioned behind the solar member, there is an air gap distance between the surface and the solar member of at least 1.59 mm to 6 m.

In any one or more of the embodiments above each of the first and second components may contain non-liquid component particulates having a size of no greater than 841 microns, no more than a 1.4 angularity, and have fineness modulus of no more than 3.7, wherein the coating, when applied on and/or within at least one of the back-side and the back-sheet of the solar member, and/or when applied on and/or within a surface of the substrate, has a thickness that is not greater than five millimeters when in a dry state.

In any one or more of the embodiments above, the first component may be between 35% and 65% of the coating, and when the coating includes the second component, the second component may be between 65% and 35% of the coating when the first and second components are mixed.

In any one or more of the embodiments above, the surface of the substrate may comprise at least one of a biaxially-oriented polyethylene terephthalate (mylar), a polished metal, and a glass mirror In any one or more of the embodiments above, the reflective material may be comprised of at least one of an outdoor/exterior rated liquid white and/or silver liquid paint, an outdoor rated liquid white and/or silver liquid enamel, and/or a wet/moist glue, and wherein the reflective material, when a liquid, may optionally contain no more than 10% of a solid particulate comprised of at least one of sea salt, powdered glass, crushed and/or powdered quartz, crushed and/or powdered white quartz, and a light-colored sand.

In any one or more of the embodiments above, wherein the at least one of a back-side and a back sheet may be comprised of at least one of an acrylonitrile butadiene styrene, and a BoPET (Biaxially-oriented polyethylene terephthalate), and an acrylonitrile butadiene styrene (ABS).

In the following drawings, the terms solar cell/solar cell panel/solar cell module are jointly combined into, and defined as, the commonly utilized term "solar members", unless otherwise clearly indicated, such as in the description of a bifacial solar panel in drawing number 3, where it is necessary to distinguish a front set of solar cells and a back set of solar cells, which jointly comprise a solar module.

DETAILED DESCRIPTION

The description is not intended in a limiting sense, and is made solely for the purpose of illustrating the general principles of this subject matter. The various features and advantages of the present disclosure, none of which are drawn to scale, may be more readily understood with reference to the following detailed description taken in conjunction with the accompanying drawings. As previously explained, the term "solar member" for purposes of the drawings herein includes and defines the multiple terms "solar cells", "solar panels", and "solar modules", unless otherwise clearly indicated, as in FIG. 3 which describes a bifacial solar module, where there are two sets of solar cells that comprise the bifacial solar module.

Figure 1:
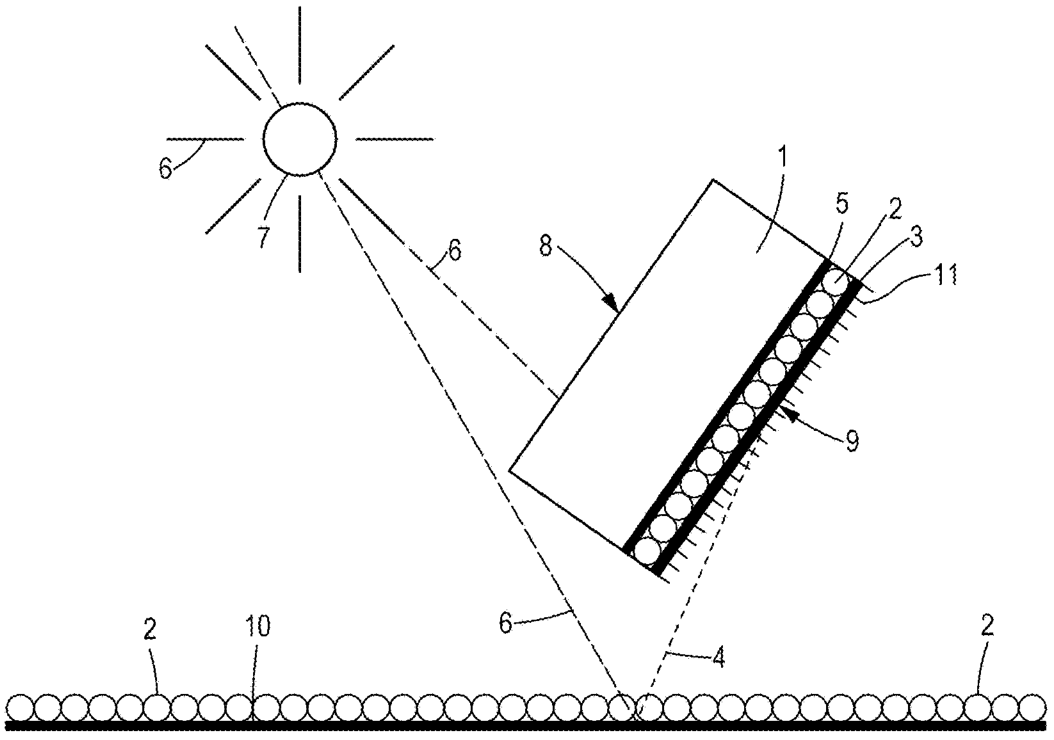
FIG. 1 a side view of a solar panel, with at least one of the coatings and reflective covering disclosed herein applied to the back-sheet of the solar member, with an optional hard protective covering, and with a final optional special evaporative cooling coating.

Referring now to the drawings in detail, where like numerals refer to like parts or elements, there is shown in FIG. 1 a side view, not drawn to any scale, of a solar member 1 with at least one of the special coatings 2 disclosed herein, with an optional hard, solid, protective covering 3, all directly and consecutively applied to the back-sheet 5 of the solar member 1, so as to at least one of increase the efficiency/electrical output and/or cool the solar member 1. Sunlight 6 from the sun 7 is shown entering into the front side 8 of a solar member 1, as well as indirect light 4 from the sun 7 being reflected from the ground 10 into the back side 9 of the solar member 1. The ground 10 may optionally be coated/paved with at least one of the special coatings 2 and/or coatings 2 disclosed herein, as shown herein. Both the front side 8 and the back-sheet 5 of a solar member 1 are well understood by those skilled in the art, with the top front side 8 typically being comprised of a glass, and with the back-sheet 5 typically being comprised of a tough plastic, or the like.

Optionally, the back-sheet 5 of a solar member 1 may also optionally be constructed of, and/or contain, at least one of the coatings 2 disclosed herein. This would avoid the need to apply one of the coatings 2 to the back-sheet 5 of a solar member 1 in the field. Whether one of the coatings 2 disclosed herein is applied to a solar member 1 as a coating 2 (layer), or whether the back-sheet 5 of a solar member 1 is constructed in conjunction with one of the coatings 2 disclosed herein (e.g., the coating 2 may be applied to, or embedded in, or mixed into the material of the back-sheet when manufactured, or the like), the type of plastic utilized in the back-sheet 5 would preferably be comprised of at least one of an acrylonitrile butadiene styrene (ABS) type plastic and/or of a BoPET (Biaxially-oriented polyethylene terephthalate) type plastic, or the like.

At least one of the special coatings 2 disclosed herein, optionally includes and/or contains and/or comprises a cement, (which has been previously defined and which is well understood by those skilled in the art), which cement, as also defined herein, may optionally include a cement curing retardant, which curing retardants are not individually shown herein as they are also well understood by those skilled in the art, so as to slow the curing time of the coating 2 after being mixed with a liquid, especially in hot weather, so as to enable the coating 2 to be maintained in an application tank, bucket, or the like, for a longer period of time without unduly hardening/curing during the coating 2 application process to a solar member 1.

As illustrated in FIG. 1, the translucent portion of sunlight 6 from the sun 7 going into and through the front side 8 of a solar member 1, as well as any indirect sunlight 4, interacts with at least one of the coatings 2 disclosed herein so as to at least one of provide and/or reflect and/or scatter additional favorably wave-altered light, such as sunlight 6, and/or electromagnetic radiation (electromagnetic radiation is understood by those of skill in the art) back into and around/near the solar member 1 so as to produce even more electrical energy (electrical energy is not shown herein as indirect sunlight is well understood by those of skill in the art). The said reflection and/or scattering of electromagnetic radiation caused by the coating 2 positively affects both the coated 2 solar member 1 and nearby uncoated solar members 1, which nearby uncoated solar members are not shown in FIG. 1, as same would be well understood by those of skill in the art reading the disclosure herein. Herein, the term "positively affects" means the coating 2 increases the efficiency/electrical output of solar members 1.

In solar member 1 applications, sunlight 6 entering from the front side 8 of a solar member 1 is typically utilized for electrical energy production. Sometimes costly metamaterials (not shown herein, as metamaterials are well understood by those of skill in the art) are used on top of the front side 8 of solar members 1 to bend incoming light waves more directly into the solar members 1.

Figure 3:
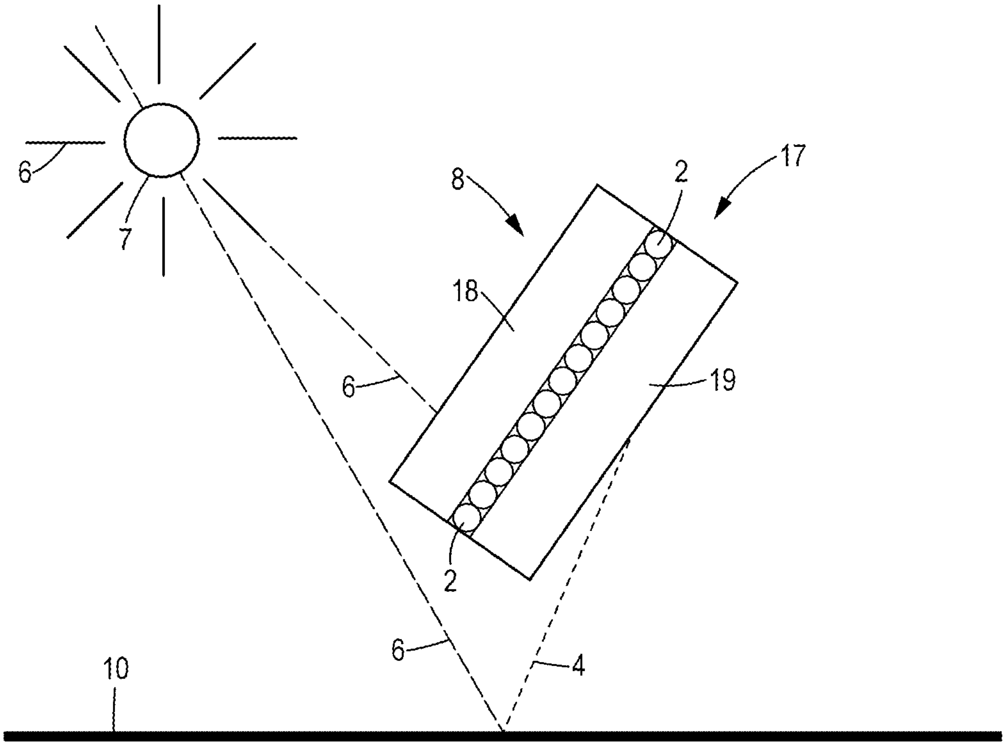
FIG. 3 is a side view of a bifacial solar module, with at least one of the coatings disclosed herein, without any reflective backing, having been applied between two respective sets of solar cells, with a first set of solar cells facing the sun, and with a second set of solar cells facing away from the sun, being positioned behind the first set of solar cells, with both the first and second set of solar cells comprising a bifacial solar module.

Also, sometimes bifacial types of solar members/modules 1 (bifacial types are not shown herein as same are well understood by those skilled in the art, but a bifacial solar member/module is shown herein in FIG. 3), are utilized with solar cells being placed on both the front side 8 (the front side 8 would be the same on both a common solar member 1, as shown herein, and on a bifacial solar member/module), under the glass front cover (a front glass cover is not shown herein as same is well understood by those of skill in the art) for incoming direct sunlight 6, and on the back-side 9 (the back-side 9 would be the same on both a common solar member 1, as shown herein, and on a bifacial solar member/module) of the bifacial solar member/module under a second back glass cover (a back glass cover is not shown herein as same is well understood by those skilled in the art) so as to capture as much indirect sunlight 4 as possible, and thereby convert both direct sunlight 6 and indirect sunlight 4 into electrical production, as is well understood by those of skill in the art. Indirect sunlight 4 is still sunlight 6 originating from the sun 7, but is sunlight 6 that is reflected from the atmosphere (which is well understood by most everyone), the ground 10, or other nearby objects (not shown herein), as opposed to coming directly from the sun 7 itself.

Additionally, instead of solely using direct sunlight 6 entering the front side 8, and/or using indirect sunlight 4 entering the back-side 9, of solar members 1 the electromagnetic wavelengths of heat radiating (radiating heat, or thermal radiation, is also a form of electromagnetic radiation, as is well understood by those of skill in the art) from at least one of the coatings 2 disclosed herein can also be used to increase the effectiveness/efficiency/electric output of both directly coated solar members 1 and of nearby solar members that have no coating application. Nearby solar members that have no coating application are not shown herein, as same would be well understood by those skilled in the art.

Electrons (electrons are not shown herein as electrons are well understood by those of skill in the art) with energy levels that will not enable them to be transitioned into the conduction band (not shown herein, as core bands, valence bands, and conduction bands of electrons surrounding atoms are all well understood by those skilled in the art) within a solar member 1 can also be modified, by an inelastic reflection off at least one of the special coatings 2 disclosed herein, into an energy level that will enable the electron to transition into the conduction band of a solar member 1. Generally, it is reported that light with wavelengths between three hundred fifty and one thousand one hundred nanometers (nm) is sufficient to knock an electron out of a silicon atom's valence band into the conduction band (where it can be used for work), and electrons with energy level gains between one and one-tenth and three and a half electron volts (1.1 and 3.5 eV) have a sufficient energy level to transition into the conduction band.

Generally in most solar members 1, useful electrical production occurs when electrons are knocked out of their natural orbit around atoms by photons and into the conduction band of an atom within a solar member 1, which is all well understood by those skilled in the art. Utilization of at least one of the coatings 2 disclosed herein, in at least one of the manners disclosed herein, can facilitate and increase knocking more and additional electrons out of their natural orbit and into the conduction band than is possible via the traditional and common use of incoming direct sunlight 6 and/or indirect light 4 alone.

Via utilization of at least one of the coatings 2 disclosed herein, electrons with too high of an energy level can be reflected back into and/or scattered into solar members 1 at modified and lower energy levels that will enable them to be transitioned into the conduction band of the atoms of solar members 1. For example, in a silicon solar cell (while a generalized solar member 1 of any type is shown herein, a specific silicon solar cell within a solar member 1 is not shown herein, as same well understood by those of skill in the art), if a photon strikes an electron in the silicon atom's outer valence band so as to provide too much energy (above 3.5 eV), the electron gains so much energy that it is one of knocked into the conduction band with most of its energy lost as heat, and knocked clear out of both the valence band and the conduction band, and is therefore one of mostly unusable and unusable for electrical power production. However, if the now high-energy electron strikes at least one of the special coatings 2 disclosed herein, the high-energy electron loses some of its energy as it bounces off of, and/or is inelastically reflected from, at least one of the coatings 2 disclosed herein, and its energy level can be reduced to between 1.1 and 3.5 eV, where it can now be transitioned into the conduction band so as to now provide useful electrical work.

Similarly, a high-energy photon (with a wavelength above about one thousand one hundred nanometers) from direct sunlight 6 and/or from indirect sunlight 4, that makes it through the solar member 1 (such as translucent light, which is well understood by those skilled in the art) without striking an atom or electron, as it bounces off of, and/or is inelastically reflected by, and/or is scattered by, the coating 2, could lose enough energy so as to provide an appropriate amount of energy for electrons within the solar member 1 material to transition electrons into the conduction band and provide useful electrical energy. Further, heat/radiant and/or other energy within the coating 2 itself could also add/provide/supply enough additional energy to low-energy light 6 (with a wavelength below about three hundred fifty nanometers) so as to inelastically reflect and/or scatter higher energy electromagnetic radiation (that can provide energy levels of about 1.1 to 3.5 eV to electrons) to the electrons in both the coated solar member 1 and into nearby solar members (nearby solar members are not shown here as same would be well understood by those of skill in the art) that are uncoated, so as to enable electron transitions into the conduction bands, so as to produce useful electrical energy.

After interacting with, and/or being inelastically reflected and/or scattered from at least one of the coatings 2 disclosed herein, at least a portion of otherwise unusable, or mostly unusable, electromagnetic radiation and/or sunlight 6 will have been altered into additional wavelengths and/or energy levels that are favorable for, and increase, electrical production from both directly coated, and from nearby uncoated, solar members.

Also, some translucent light 6 and/or indirect light 4, with existing energy levels of about 1.1 to 3.5 eV, that makes it through a solar member 1 without interacting with an atom or an electron, could simply be elastically reflected by at least one of the coatings 2 disclosed herein, back into the solar member 1 and/or into nearby solar members, whether or not such nearby solar members are coated 2, so as to interact with electrons within the solar member 1 and/or nearby solar members so as to provide additional electrical output.

At least one of the coatings 2 disclosed herein can also advantageously act to extend heat rejection advantages from solar members 1 by means of releasing heat radiation in wavelengths between six and fifteen micrometers. Such wavelengths increase the likelihood of minimizing heat radiation bounce-back from the atmosphere, thereby increasing the likelihood of sending the heat out and away into deep space, all while assisting in more effectively cooling the solar members 1, so as to assist in increasing efficiencies/electrical output.

Further, via application of at least one of the coatings 2 disclosed herein, the typical positive photon added energy levels to solar member 1 atom electrons in valence bands of about 1.1 eV to 3.5 eV, can be expanded from a typical useful light/electromagnetic wavelength range, of about three hundred fifty nanometers to one thousand one hundred nanometers, to electromagnetic wavelengths of between about two hundred nanometers to one hundred meters, which additionally enhances electrical production output abilities of both directly coated 2 and nearby uncoated solar members, as well as, over a period several months, to uncoated solar members which may be as far away as about one hundred meters from coated solar members 1.

All elements/materials in the coating 2 itself, as disclosed herein, would preferably have non-liquid component particulate sizes of 841 microns (20 mesh), or smaller, (more specifically greater than 0 microns up to 841 microns) and any type of sand in the coating 2 would preferably have no more than a 1.4 angularity, and a fineness modulus of no more than 3.7. Further, all the coatings 2 would preferably have an applied and dried (layer) thickness that is greater than 0 millimeters and not greater than five millimeters (one-half centimeter). Mesh sizes, angularity, and fineness modulus are all well understood by those of skill in the art.

While the coatings 2 disclosed herein are all rugged and capable of withstanding typical varying outdoor weather conditions, in the event additional weather protection on the back-side 9 is desired, a hard, solid, back cover 3, such as a plastic, a metal, or the like, cover can optionally be used.

Lastly, a final optional special evaporative cooling coating 11 is shown as applied as a final and last cooling coating 11. The evaporative cooling coating 11 may comprise a cooling material 11 comprised of a thermo-responsive water absorption and/or water adsorption and water desorption material, such as a thermo-responsive polymer and a hydrophilic component and/or sodium alginate, or the like, which naturally absorbs moisture from the air during cooler periods, and which evaporates, affording evaporative cooling advantages, during hotter periods, all without having to obtain and utilize any actual fresh water supplies (such as from a lake, a stream, a river, a canal, a water supply pipe, or the like). Cooling solar members 1 is advantageous, as solar members 1 lose both efficiency and longevity during periods of excessive heat, at least above twenty-five degrees celcius (C).

While a final optional special evaporative cooling coating 11 is shown herein as being applied as a final and last cooling coating 11 on a coated 2 solar member 1, such a special evaporative cooling coating 11 can also be utilized on any conventional uncoated solar member. Uncoated solar members are not shown herein (and are also referenced in other drawings herein), but uncoated solar members are well understood by those skilled in the art, and are such as the solar member shown as 1 in FIG. 1, but without any coating 2 that is shown in FIG. 1.

Figure 2:
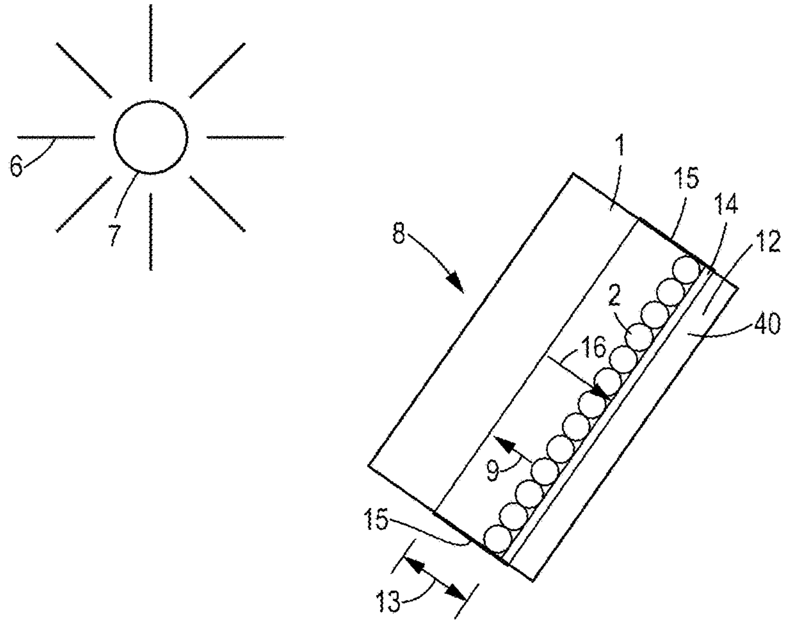
FIG. 2 is a side view of a solar member with a solid separate surface behind, which solid separate surface (such as a separate plastic surface, a separate wood surface, a separate foam board surface, or the like) has been coated with at least one of the herein disclosed special coatings, which special coating has been applied to the front side of the solid separate surface that faces the back side/back-sheet of the solar member, where the solid coated separate surface is within a distance of at least one-sixteenth inch to one foot of the back-side/back-sheet of the solar member, and where the coating, with an optional reflective type backing, is applied in a reverse order from when being applied directly to a solar member.

FIG. 2 is a side view of a solar member 1, not drawn to any scale, with a separate surface 12 (of a substrate 40) positioned behind the solar member 1. In an embodiment, the surface may be solid or continuous. The separate surface 12 (may include but is not limited to a plastic surface, a wood surface, a glass surface, a foam board surface, a foil type surface, a mylar surface, an acrylonitrile butadiene styrene plastic type surface, a BoPET (Biaxially-oriented polyethylene terephthalate) plastic type surface, an acrylonitrile butadiene styrene (ABS) plastic type surface, any rigid surface, or the like) may be coated 2 with at least one of the herein disclosed coatings 2, which coating 2 has been applied to the front side 16 of the surface 12 that faces the back side 9 of the solar member 1, and where the coated (separate) surface 12 is preferably within a distance of at least 1.59 mm to 304.8 mm ("mm" stands for millimeters) of the exterior back-side 9 of the back-sheet 5 of the solar member 1 so as to provide an air gap space 13 of at least 1.59 mm to 304.8 mm (not drawn to any scale) so as to permit natural heat from the solar member 1 to escape.

Such a solid separate surface 12 of a substrate 40, which is coated 2 with at least one of the coatings 2 disclosed herein, may be positioned behind the back-side/back exterior side 9 of a solar member 1, and would preferably be comprised of one of a separate plastic surface, a separate wood surface, a glass surface, a separate foam board surface, a foil type surface, an acrylonitrile butadiene styrene plastic type surface, a BoPET (Biaxially-oriented polyethylene terephthalate) plastic type surface, any rigid surface, an acrylonitrile butadiene styrene (ABS) type plastic type surface, or the like, with the solid separate surface 12 being coated on its front side 16, with the front side 16 of the solid separate surface 12 facing the back-side/back exterior side 9 of the solar member 1, with the coating 2 being comprised of at least one of the coatings 2 disclosed herein.

However, here, with the coating 2 and a reflective material 14 being applied to a separate surface 12 positioned behind the solar member 1, the coating 2 should be applied in a reverse order from that of when being applied directly to a solar member 1 itself, so that any reflective material 14 is first applied to the separate surface 12, (exemplary reflective materials 14 include but are not limited to, a white or silver paint, a white or silver enamel, a mylar, a polished metal, or other reflective matter, or the like) and is next followed by applying the coating 2 on top of the reflective material 14.

The optional reflective material 14, although not shown in FIG. 1, could optionally be applied between the coating 2 and the optional hard, solid, protective covering 3 shown in FIG. 1.

Here, as an example of an attachment means 15, the separate surface 12 is shown as being positioned spaced apart from and attached behind the back-side 9 of a solar member 1 by means of two attachment bars 15, or the like. In other embodiments, other fastener types may be used instead of attachment bars 15 to maintain an air gap 13 between the solar member 1 and the coating 2, which coating 2 is shown herein as having an optional reflective surface 14 positioned between the coating 2 and the solid separate surface 12 of a substrate 40.

Figure 5:
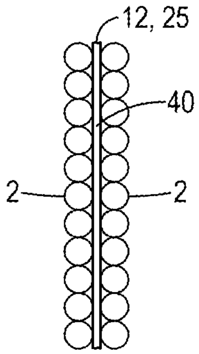
FIG. 5 is a side view of a vertically inclined flat separate solid surface, which has been coated on both sides with at least one of the coatings disclosed herein, and which can be positioned at any desired location within a solar field/solar array.
Figure 6:
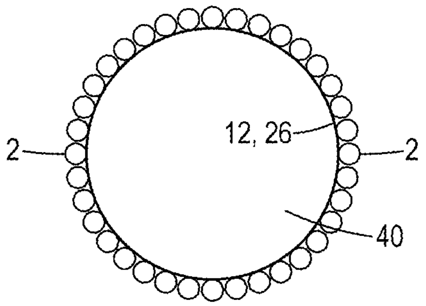
FIG. 6 is a top view of a vertically inclined rounded separate solid surface, which has been coated with at least one of the coatings disclosed herein, and which can be positioned at any desired location within a solar field/solar array.
Figure 7:
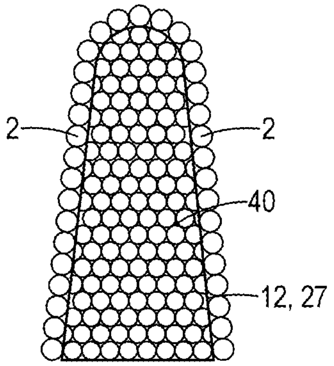
FIG. 7 is a side view of a vertically inclined dome-shaped separate solid surface, which has been coated with at least one of the coatings disclosed herein, and which can be positioned at any desired location within a solar field/solar array.
Figure 8:
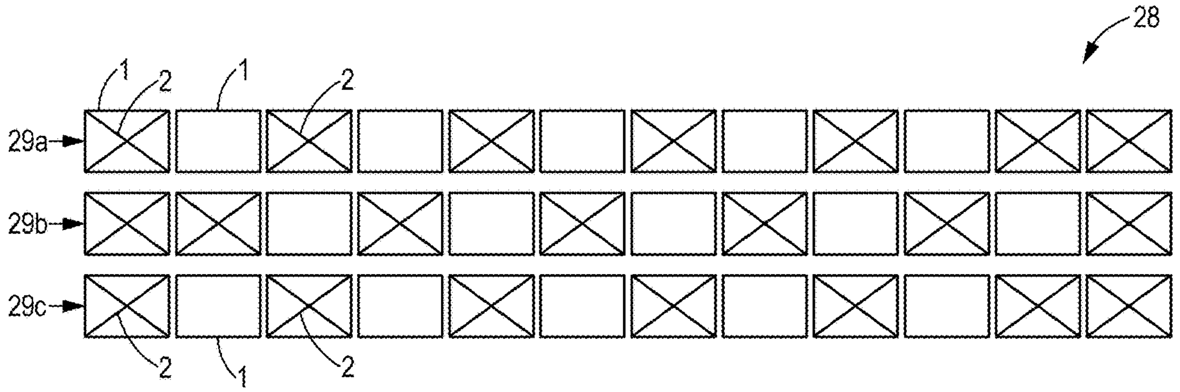
FIG. 8 is a top view of a solar field/array where every other solar member is coated with at least one of the coatings disclosed herein.
Figure 9:
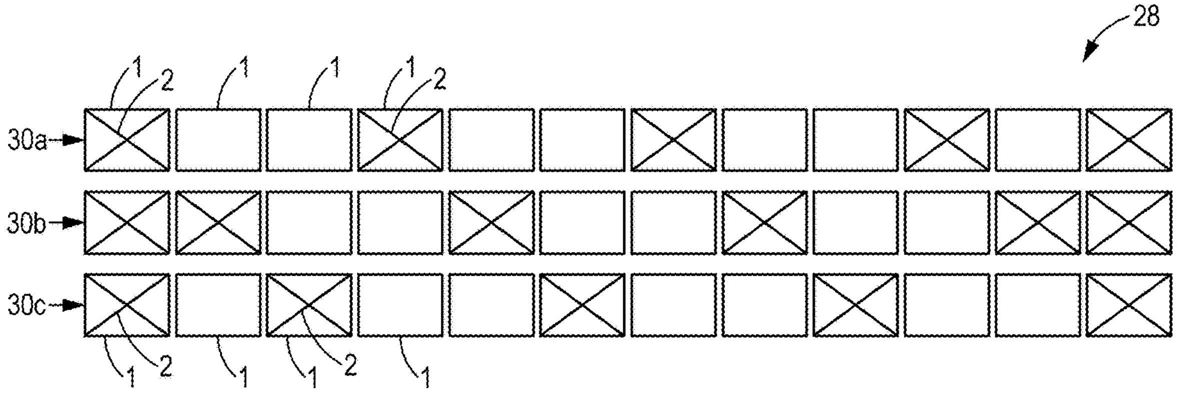
FIG. 9 is a top view of a solar field/array where every third solar member is coated with at least one of the coatings disclosed herein.
Figure 10:
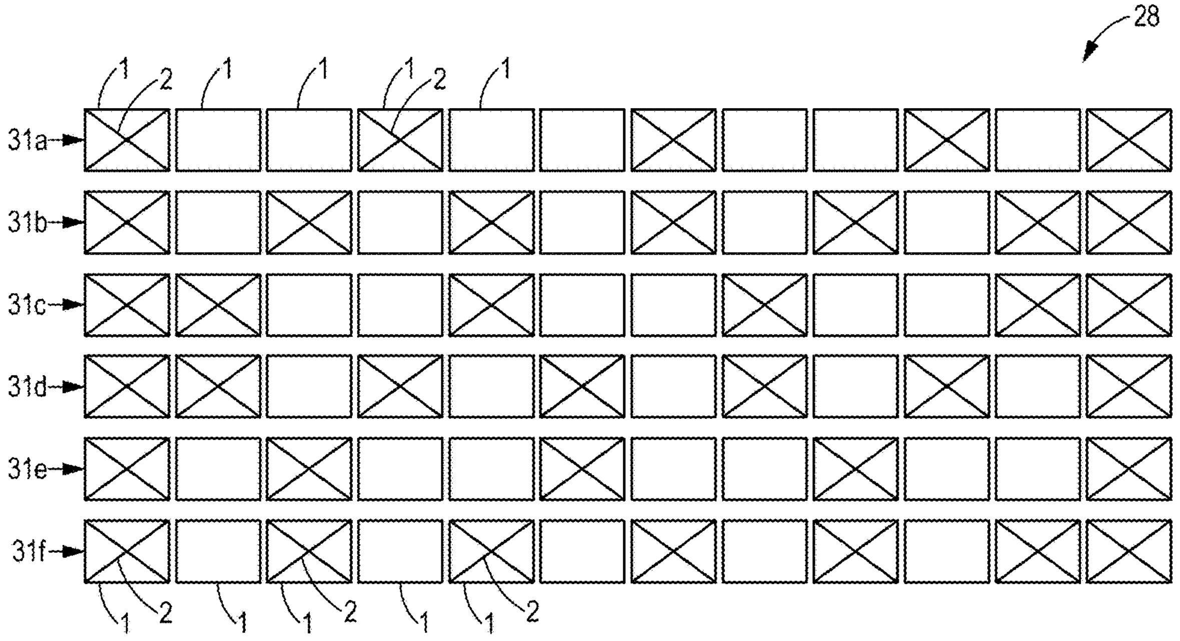
FIG. 10 is a top view of a solar field/array where every other solar member is coated with at least one of the coatings disclosed herein in one row, and where every third solar member is coated with at least one of the coatings disclosed herein in the respective row above and below the row where every other solar member is coated, and with every row above and below the row where every third solar member is coated having every other solar member coated, with all respective rows coated in a staggered manner.

In some embodiments an attachment means 15 may be unnecessary, especially when separately coated 2 structures (also a substrate 40), such as shown in FIGS. 5, 6, and 7, as examples, are strategically and independently placed within a solar field/solar array in optional manners, such as shown in FIGS. 8, 9, and 10, as examples.

The provision of at least one of the coatings 2 disclosed herein being applied to a solid separate surface 12 that is positioned and attached behind the back-side 9 of a solar member 1 affords the advantage of supplying the coating 2 to pre-manufactured surfaces 12, without the necessity to apply the coatings 2 in the field, which would likely be more time-consuming and costly. Further, when placing the coating 2 on a solid separate surface 12 that is positioned and attached behind the back-side 9 of a solar member 1, with at least a 1.59 mm to 304.8 mm air gap 13 separation distance between the solar panel 1 and the solid separate surface 12, there is adequate space for the coating 2 to positively affect both a traditional and common solar member 1, and a bi-facial solar member/module, which is well understood by those skilled in the art, and which is shown as 17 in FIG. 3.

As in FIG. 1, the sun 6 in FIG. 2 is shown as providing sunlight 6 to the front side 8 of the solar member 1.

FIG. 3 is a side view of a bifacial solar member/solar module 17, not drawn to any scale, with at least one of the coatings 2 disclosed herein (without any reflective backing such as shown as 14 in FIG. 2) having been applied/provided between two respective sets of solar cells, shown herein as 18 and 19 of the coated 2 bifacial solar member/solar module 17 where a first set of solar cells 18 face the sun 7, and where a second set of solar cells 19, being positioned behind the first set of solar cells 18, face away from the sun 7.

While the first set of solar cells 18, with at least one of the coatings 2 disclosed herein positioned behind it, faces the sun 7 and receives direct sunlight 6, the second set of solar cells 19, which also receives the advantage of at least one of the coatings 2 disclosed herein, being positioned behind the first set of solar cells 18, faces away from the sun 7 and receives indirect sunlight 4 reflected from at least one of the atmosphere and surrounding objects, such as the ground 10, hills, buildings, or the like.

The placement/provision of at least one of the coatings 2 disclosed herein between such first set of solar cells 18 and a second set of solar cells 19, together comprise a coated 2 bifacial solar member/solar module 17, which advantageously affords a bifacial solar member/solar module 17 manufacturer to require only one coating 2 application, so as to lighten weight, and so as to save in coating 2 application time, as well as to save in material costs, over applying at least one of the coatings 2 disclosed herein to two full respective and individual traditional and common solar members 1, such as individually shown as 1 in FIG. 1.

The sun 6 is also shown herein as providing direct sunlight 6 to the front side 8 of the bifacial solar member/solar module 17, so as to provide direct sunlight 6 to the first set of solar cells 18 facing the sun 7.

Figure 4:
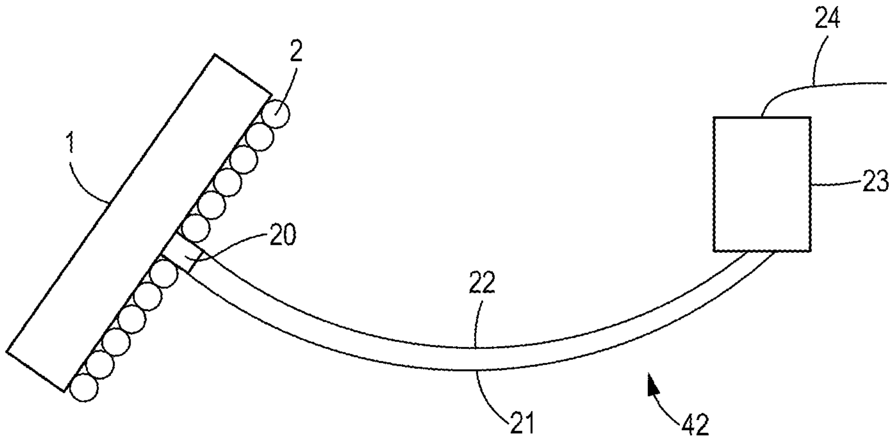
FIG. 4 is a front view of a coated solar member, with a positive lead wire and a negative wire leading from the coated solar member to an inverter, which changes the DC electricity into AC electricity, and where the inverter is set to not operationally shut off until the exterior solar irradiance level drops to seventy, or less.

FIG. 4, not drawn to any scale, is a front view of solar member 1 that has been coated 2 with at least one of the coatings 2 disclosed herein, with a junction box 20 provided on the solar member 1, and with a positive wire 21 and a negative wire 22 leading from the junction box 20 on the coated 2 solar panel to an inverter 23, which inverter 23 changes the direct current (DC) electricity, from the positive circuit wire 21 and from the negative circuit wire 22, produced from the solar member 1 into alternating current (AC) electricity, which is then sent from the inverter 23 through an AC wire 24 for useful electrical work, as is well understood by those skilled in the art. Instead of being set to turn off and disengage when solar irradiance levels drop to one hundred or less, as is common in the solar industry, the inverter 23 is set to not operationally shut off until the exterior solar irradiance level drops to seventy, or less, which, by reason of the coating's provision of additional and above-normal electrical output during periods of low solar irradiance, affords more cost-effective electrical production. Junction boxes 20 on the solar member 1, positive and negative DC wires 21 and 22, inverters 23, AC wiring 24, and solar irradiance levels (watts per square meter) are all well understood by those skilled in the art. Also, the circuitry 42 design sizing of the junction box 20, the DC wiring 21 and 22, the inverter 23, and the AC wiring 24, in addition to all other electrical components (which are all well understood by those skilled in the art), may be upgraded as necessary so as to accommodate the increased electrical output resulting from use of the special coating 2.

FIG. 5 is a top view of a exemplary embodiment of a vertically inclined flat separate (preferably solid) surface 12, 25, not drawn to any scale, which has been coated 2 on both sides with at least one of the coatings 2 disclosed herein, and which can be positioned at any desired location within a solar field/solar array, but which is preferably positioned within six meters, or more, of uncoated solar members. A solar field/solar array is not shown herein, as same is well understood by those skilled in the art. Due to the "Ryland effect" and/or the "halo effect" of the coatings 2 disclosed herein, simply installing one or more vertically inclined flat separate surfaces 25, which have been coated with at least one of the coatings 2 disclosed herein, can positively affect multiple nearby uncoated solar members (uncoated solar members are not shown herein as same are well understood by those skilled in the art, but are solar members such as a solar member 1 as shown in FIG. 1, but without any coating 2 that is shown in FIG. 1). The inclined generally flat separate (preferably solid) surface 25 would preferably be at least as high as the top of solar members in the adjacent and/or nearby solar field/solar array, with both solar members and an adjacent and/or nearby solar field/solar array being well understood by those skilled in the art.

FIG. 6 is a top view of a vertically inclined rounded separate (in an embodiment) solid surface 12, 26, not drawn to any scale, which has been coated 2 with at least one of the coatings 2 disclosed herein, and which can be positioned at any desired location within a solar field/solar array, but which is preferably positioned within six meters of uncoated solar members. Uncoated solar members are well understood by those skilled in the art, but are such as the solar member shown as 1 in FIG. 1, but without any coating 2 that is shown in FIG. 1. A solar field/solar array is not shown herein, as same is well understood by those skilled in the art.

Due to the "Ryland effect" and/or the "halo effect" of the coatings 2 disclosed herein, simply installing one or more vertically inclined generally rounded separate (preferably solid) surfaces 26, which have been coated with at least one of the coatings 2 disclosed herein, can positively affect multiple uncoated solar panels (not shown herein). The inclined rounded separate (preferably solid) surface 26 would preferably be at least as high as the top of uncoated solar members in the adjacent and/or nearby solar field/solar array, with both uncoated solar members and an adjacent and/or nearby solar field/solar array being well understood by those skilled in the art.

FIG. 7 is a side view of a vertically inclined dome-shaped separate (preferably solid) surface 12, 27, not drawn to any scale, which has been coated 2 with at least one of the coatings 2 disclosed herein, and which can be positioned at any desired location within a solar field/solar array, but which is preferably positioned within six meters of uncoated solar members. Uncoated solar members are well understood by those skilled in the art, but are such as the solar member shown as 1 in FIG. 1, but without any coating 2 that is shown in FIG. 1.

A solar field/solar array is not shown herein, as same is well understood by those skilled in the art. Due to the "Ryland effect" and/or the "halo effect" of the coatings 2 disclosed herein, simply installing one or more vertically inclined dome-shaped separate (preferably solid) surfaces 27, which have been coated 2 with at least one of the coatings 2 disclosed herein, can positively affect multiple uncoated solar members. Uncoated solar members are well understood by those skilled in the art, but are such as the solar member shown as 1 in FIG. 1, but without any coating 2 that is shown in FIG. 1. The inclined dome-shaped separate solid surface 27 would preferably be at least as high as the top of uncoated solar members in the adjacent and/or nearby solar field/solar array, with both solar members and an adjacent and/or nearby solar field/solar array being well understood by those skilled in the art.

FIG. 8 is a top view of an exemplary solar field/array 28, not drawn to any scale, where every other solar member 1 is coated (such coatings 2 are shown and identified in this drawing by the letter "X") with at least one of the coatings 2 disclosed herein. Coating 2 every other solar member 1 in a solar field/array 28 is as effective, and sometimes more effective, in increasing the efficiency/electrical output of the solar field/array 28 than as coating 2 every individual solar member (such as shown as 1 in FIG. 1) in the solar field/array 28. This is because of at least one of the "Ryland effect" and the "halo effect" of the coating 2, which coating's 2 positive effect in increasing efficiency/electrical output extends to adjacent and/or nearby uncoated solar members. Uncoated solar members are well understood by those skilled in the art, but are such as the solar member shown as 1 in FIG. 1, but without any coating 2 that is shown in FIG. 1, and are such as the solar members 1 shown herein without an "X" designation.

Additionally, each respective solar member 1 at each end of each respective row is preferably coated 2, as shown herein, so as to permit maximum exposure of all direct 6 and indirect sunlight 4 (direct 6 and indirect sunlight 4 is not shown herein, but is shown as 6 and 4 in FIG. 1) to the coated solar members 1 at the end of each row of solar cell members 1 in the solar field/array 28 in both the mornings and in the evenings, when the sun (not shown herein, but shown as 7 in FIG. 1) is at the Easterly and Westwardly side of the solar field/array 28 in the Northern hemisphere, and is at the Westwardly and Easterly side of the solar field/array 28 in the Southern hemisphere.

Further, in addition to coating 2 every solar member 1 at the end of each respective row of solar members 1, it is preferable to stagger the coating 2 of every other solar member 1 in each respective row, so that a coated solar member 1 would be both above and below an uncoated solar member when there are more than two rows, such as the three rows 29*a*, 29*b*, and 29*c* as shown herein, of solar members in the solar field/array 28. Coating 2 every other solar member 1 is also shown herein as only one example of how coated solar members 1 may be placed in a staggered position within a solar field/array 28.

FIG. 9 is a top view of a solar field/array 28, not drawn to any scale, where every third solar member 1 is coated 2 (coatings 2 are shown and identified in this drawing by the letter "X") with at least one of the coatings 2 disclosed herein. Coating 2 every third solar member 1 in a solar field/array 28 is close to being as effective as coating 2 every other solar member 1 as shown in FIG. 8, but is half the cost of materials and labor as coating 2 every other solar member 1. Saving half the coating cost when coating 2 a large solar field/array 28, while still achieving a good increase in efficiency/electrical output, may be preferable in some circumstances. Achieving good increases in efficiency/electrical output by coating 2 only every third solar member 1 again results because of at least one of the "Ryland effect" and the "halo effect" of the coating 2, which coating's 2 positive effect in increasing efficiency/electrical output extends to adjacent and/or nearby uncoated solar members. Uncoated solar members are well understood by those skilled in the art, but are such as the solar member shown as 1 in FIG. 1, but without any coating 2 that is shown in FIG. 1, and are such as the solar members 1 shown herein without an "X" designation.

Additionally, each respective solar member 1 at each end of each respective row is preferably coated, as shown herein, so as to permit maximum exposure of all direct and indirect sunlight (direct and indirect sunlight is not shown herein, but is shown as 6 and 4 in FIG. 1) to the end of each row solar cell member 1 in the solar field/array 28 in both the mornings and in the evenings, when the sun (the sun is not shown herein, but is shown as 7 in FIG. 1) is at the Easterly and Westwardly side of the solar field/array 28 in the Northern hemisphere, and is at the Westwardly and Easterly side of the solar field/array 28 in the Southern hemisphere.

The subject drawing has a total of three rows, 30*a*, 30*b*, and 30*c*, in order to depict the additionally preferred staggering of the coated solar members 1 in each respective row. Coating every third solar member 1 is also shown herein as another example of how coated solar members 1 may be placed in a staggered position within a solar field/array 28.

FIG. 10 is a top view of a solar field/array 28, not drawn to any scale, where there is a combination of every third solar member 1 being coated 2 in one row 31*a*, as shown in FIG. 8, and where every other solar member 1 is shown as being coated 2 in the row immediately below row 32*a*, as shown in FIG. 8, with a continuing sequence of every third solar member 1 being coated 2 in the next row below 31*c*, and with every other solar member 1 being coated 2 in the next row below 31*d*, and so on, but with each solar member at the end of each respective row, 31*a*, 31*b*, 31*c*, 31*d*, 31*e*, and 31*f*, being coated. Uncoated solar members are well understood by those skilled in the art, but are such as the solar member shown as 1 in FIG. 1, but without any coating 2 that is shown in FIG. 1.

This coating 2 sequence affords efficiency/electrical output level increases between that of coating 2 every other solar member 1 in a row and coating every third solar member 1 in a row, while also affording a mid-point coating time/cost, which may be preferable in some situations.

Additionally, each respective solar member 1 at each end of each respective row is preferably coated 2, as shown herein, so as to permit maximum exposure of all direct and indirect sunlight (direct and indirect sunlight is not shown herein, but is shown as 6 and 4 in FIG. 1) to the end of each respective row, 31*a*, 31*b*, 31*c*, 31*d*, 31*e*, and 31*f*, of solar members 1 in the solar field/array 28 in both the mornings and in the evenings, when the sun (the sun is not shown herein, but is shown as 6 in FIG. 1) is at the Easterly and Westwardly side of the solar field/array 28 in the Northern hemisphere, and is at the Westwardly and Easterly side of the solar field/array 28 in the Southern hemisphere.

Other, and even more sparse, staggered placement arrangements of coated 2 solar members 1 in a solar field/array 28 may be made as preferred, based upon coating 2 cost factors in any particular situation, as positive coating 2 effects spread over time, and can be attained, within a period of about sixty to ninety days, on uncoated solar members 1 that are at least as far as twenty meters away from coated 2 solar members 1. Uncoated solar members are well understood by those skilled in the art, but are such as the solar member shown as 1 in FIG. 1, but without any coating 2 that is shown in FIG. 1, and are such as the solar members 1 shown herein without an "X" designation.

INDUSTRIAL APPLICABILITY

In general, the foregoing disclosure finds utility in various commercial and industrial applications, such as in the energy production industry, in providing increased electrical output from solar members. The present disclosures relate to improved methods to enable solar members to produce more electrical power per given area, such as per square meter for example, than afforded by traditional solar members without any of the special coatings disclosed herein, and to typically stay cooler than traditional solar panels, which also can increase electrical power output, as heated solar panels can degrade both electrical power output and solar cell life span, which present disclosures are therefore preferable for most any useful solar member electrical energy supply purpose. Such an improved electrical power production method would at least one of: enable the reduction in size and cost of solar members; enable the reduction in size and cost of at least one of charge controllers, wiring, and inverters; and/or would reduce land area and/or rooftop area requirements for the production of a desired amount of electrical power via solar member electrical production.

Herein, the disclosed coatings are comprised of one or more solid particulates in a first component, and of one of a liquid and a wet/moist component in a second component. Solid particulates may include crushed and/or powdered sand, or the like, as disclosed herein, all in a particulate form, preferably with particulates no larger than sizes disclosed herein. Liquid components would include liquid paints and/or enamels, or the like. Wet/moist components would include liquid glues, moist epoxies, and the like. Both liquids and wet/fluid components can optionally be mixed with solid particulates to form a paste-like "coating" substance that is easily applied to the back of solar members and/or to the front of a solid separate surface that is placed behind or near solar members. As used herein, the term "reflective material" includes liquids and/or solids that are placed behind the coatings so as to at least one of reflect and scatter at least one of electromagnetic radiation/light and electrons. When volume percentages of compositions of solid particulates, and/or liquid components, and/or wet/moist components are cited, the percentages are based upon original volume, and not upon weight unless otherwise stated, with original volume for liquids and wet/moist materials being based upon their original liquid/wet/moist condition, and not when dried.

As utilized hereinabove, as well as in the below Claims, the term "solar member", when utilized in the following claims, encompasses solar cells, solar panels, and solar modules, unless clearly indicated otherwise.

What is claimed is:

1. A method of increasing electrical output of a solar member, the solar member including a back-side, the method comprising:
   - disposing a special coating on or within the back-side of the solar member to make a specially coated solar member, the special coating adapted to elastically or inelastically scatter (i) received light into at least one light wavelength or (ii) received radiant energy into at least one radiant energy level, wherein the light wavelength and the radiant energy level are each adapted to knock electrons out of a valence band and into a conduction band of a solar cell of a member to produce additional electricity, the member including: (a) the specially coated solar member, or (b) an uncoated solar member disposed within a six-meter radius of the specially coated solar member,
   - wherein the received light includes direct light, or indirect light or translucent light;
   - wherein the special coating comprises:
     - a first component comprising silicon dioxide and cement; and
   - a second component comprising a wet liquid, the wet liquid including;
     - water; and
     - a non-corrosive outdoor rated exterior liquid paint, or a non-corrosive outdoor rated exterior liquid enamel, or a non-corrosive outdoor rated exterior liquid glue.

2. The method of claim 1 in which
   - the first component further comprises obsidian, or salt, or sea salt, or limestone, or sandstone, or granite, or quartz, or white quartz, or light colored sand, or a prism material, or diamond, or phosphor, or down-conversion crystals, or up-conversion crystals, or no more than ten percent silicon carbide.

3. The method of claim 2,
   - wherein the obsidian is at least eighty percent pure,
   - wherein the salt is at least eighty percent pure,
   - wherein the sea salt is at least eighty percent pure,
   - wherein the silicon dioxide is at least eighty percent pure,
   - wherein the limestone is at least eighty percent pure,
   - wherein the sandstone is at least eighty percent pure,
   - wherein the cement is at least eighty percent pure,
   - wherein the quartz is at least eighty percent pure,
   - wherein the white quartz is at least eighty percent pure,
   - wherein light colored sand is at least eighty percent pure,
   - wherein the prism material is at least eighty percent pure,
   - wherein the diamond is at least eighty percent pure,
   - wherein the phosphor is at least eighty percent pure,
   - wherein the down-conversion crystals are at least eighty percent pure,
   - wherein the up-conversion crystals at least eighty percent pure.

4. The method of claim 1, wherein the first component is 35% to 65% of the special coating; and wherein the second component is 65% to 35% of the special coating.

5. The method of claim 1 further comprising:

repeating, for at least a portion of a plurality of the solar members, the disposing of the special coating to make a plurality of specially coated solar members; and disposing the plurality of the solar members in a plurality of rows in a solar array, wherein a first portion of the plurality of the solar members are the specially coated solar members and a second portion of the plurality of the solar members are uncoated solar members, wherein (a) every other solar member in each row of the plurality of rows of the solar array is one of the specially coated solar members, or (b) every third solar member in each row of the plurality of rows of the solar array is one of the specially coated solar members, or (c) every solar member on the far-left end and on the far-right end of each row of the plurality of rows of the solar array is one of the specially coated solar members, or (d) the specially coated solar members are disposed in the rows of the solar array in a staggered placement, wherein (i) one of the specially coated solar members is disposed in front of, or behind, every uncoated solar member, or (ii) one of the specially coated solar members is disposed in front of, or behind, every second uncoated solar member.

6. The method of claim 1 further comprising:

disposing, in back of or behind the special coating, a reflective material or a reflective coating, the reflective coating, when dried and cured, and the reflective material each adapted to reflect scattered light or scattered radiant energy back into the solar member, wherein the scattered light or scattered radiant energy received and reflected by the reflective material or by the reflective coating has already been elastically or inelastically scattered by the special coating into light wavelengths or radiant energy levels that knock electrons out of the valence band and into a conduction band of the solar cell of the member, wherein the reflective material comprises (a) a white or light-colored sand, or (b) a biaxially-oriented polyethylene terephthalate (mylar) surface, wherein the reflective coating, before drying, comprises an outdoor exterior rated white liquid paint, or an outdoor exterior rated silver liquid paint, or an outdoor exterior rated white liquid enamel, or an outdoor exterior rated silver liquid enamel, or an outdoor exterior rated reflective liquid paint.

7. The method of claim 6, wherein in a liquid state the reflective coating further includes no more than ten percent of a solid comprising: (a) sea salt; or (b) powdered glass; or (c) crushed or powdered quartz; or (d) crushed or powdered white quartz; or (e) light-colored sand.

8. The method of claim 1, wherein the first component (a) is in crushed or powdered form, or (b) has a size of 841 micron, or smaller, or wherein the silicon dioxide has no more than a 1.4 angularity, and has a fineness modulus of no more than 3.7, or wherein the light-colored sand has no more than a 1.4 angularity, and has a fineness modulus of no more than 3.7.

9. The method of claim 1, wherein the back-side of the solar member, comprises BoPET (Biaxially-oriented polyethylene terephthalate), or an acrylonitrile butadiene styrene (ABS) material.

10. The method of claim 1 further comprising:

repeating, for a portion of a plurality of the solar members, the disposing of the special coating to make a plurality of specially coated solar members; and disposing the plurality of the solar members in a solar array, wherein a portion of the plurality of the solar members disposed in the solar array comprises the specially coated solar members and another portion comprises uncoated solar members, wherein the solar array is in electrical communication via electrical circuitry with one or more inverters, wherein the electrical circuitry and the one or more inverters are configured to operate with at least a ten percent over-electrical production design capacity of the plurality when solar irradiance levels received by the solar array is about 1,000 to 1,200, wherein the design capacity is calculated as if all solar members of the plurality were uncoated solar members, and wherein the one or more inverter(s) are configured to activate when the solar irradiance levels are seventy or less.

11. The method of claim 10, wherein the back-sheet of the solar member comprises BoPET (Biaxially-oriented polyethylene terephthalate), or an acrylonitrile butadiene styrene (ABS) material.

12. The method of claim 1 further comprising:

disposing the special coating on or within a surface of a separate substrate to make a specially coated separate substrate; and disposing the specially coated separate substrate behind the solar member.

13. The method of claim 1, in which the disposing is on the back-side, wherein the special coating has a cured and dried thickness in a range of greater than zero millimeters to five millimeters.

14. A method of increasing electrical output of a solar member, the solar member including a back-sheet, the method comprising:

disposing a special coating on or within the back-sheet of the solar member to make a specially coated solar member, the special coating adapted to elastically or inelastically scatter (i) received light into at least one light wavelength or (ii) received radiant energy into at least one radiant energy level, wherein the light wavelength and the radiant energy level are each adapted to knock electrons out of a valence band and into a conduction band of a solar cell of a member to produce additional electricity, the member including: (a) the specially coated solar member, or (b) an uncoated solar member, disposed within a six-meter radius of the specially coated solar member, wherein the received light includes direct light, or indirect light, or translucent light, wherein the special coating comprises:

a first component comprising silicon dioxide and cement; and a second component mixed with the first component to form a wet or moist paste, the second component comprising a wet liquid, the wet liquid including: water; and a non-corrosive outdoor rated exterior liquid paint, or a non-corrosive outdoor rated exterior liquid enamel, or a non-corrosive outdoor rated exterior liquid glue.

15. The method of claim 14, in which the first component further comprises obsidian, or salt, or sea salt, or limestone, or sandstone, or granite, or quartz, or white quartz, or light colored sand, or a prism material, or diamond, or phosphor, or down-conversion crystals, or up-conversion crystals, or no more than ten percent silicon carbide.

16. The method of claim 15, wherein the obsidian is at least eighty percent pure, wherein the salt is at least eighty percent pure, wherein the sea salt is at least eighty percent pure, wherein the silicon dioxide is at least eighty percent pure, wherein the limestone is at least eighty percent pure, wherein the sandstone is at least eighty percent pure, wherein the cement is at least eighty percent pure, wherein the quartz is at least eighty percent pure, wherein the white quartz is at least eighty percent pure, wherein light colored sand is at least eighty percent pure, wherein the prism material is at least eighty percent pure, wherein the diamond is at least eighty percent pure, wherein the phosphor is at least eighty percent pure, wherein the down-conversion crystals are at least eighty percent pure, wherein the up-conversion crystals at least eighty percent pure.

17. The method of claim 14, wherein the first component is 35% to 65% of the special coating; and wherein the second component is 65% to 35% of the special coating.

18. The method of claim 14 further comprising:

repeating, for at least a portion of a plurality of the solar members, the disposing of the special coating to make a plurality of specially coated solar members; and disposing the plurality of the solar members in a plurality of rows in a solar array, wherein a first portion of the plurality of the solar members are the specially coated solar members and a second portion of the plurality of the solar members are uncoated solar members, wherein:

(a) every other solar member in each row of the plurality of rows of the solar array is one of the specially coated solar members; or (b) every third solar member in each row of the plurality of rows of the solar array is one of the specially coated solar members; or (c) every solar member on the far-left end and on the far-right end of each row of the plurality of rows of the solar array is one of the specially coated solar members; or (d) the specially coated solar members are disposed in the rows of the array in a staggered placement, wherein (i) one of the specially coated solar members is disposed in front of, or behind, every uncoated solar member, or (ii) one of the specially coated solar members is disposed in front of, or behind, every second uncoated solar member.

19. The method of claim 14 further comprising:

disposing, in back of or behind the special coating, a reflective material or a reflective coating, the reflective coating, when dried and cured, and the reflective material each adapted to reflect scattered light or scattered radiant energy back into the solar member, wherein the scattered light or scattered radiant energy received and reflected by the reflective material or by the reflective coating has already been elastically or inelastically scattered by the special coating into at least one light wavelength or at least one radiant energy level that knocks electrons out of the valence band and into a conduction band of the solar cell of the member, wherein the reflective material comprises (a) a white or light-colored sand, or (b) a biaxially-oriented polyethylene terephthalate (mylar) surface, wherein the reflective coating, before drying, comprises an outdoor exterior rated white liquid paint, or an outdoor exterior rated silver liquid paint, or an outdoor exterior rated white liquid enamel, or an outdoor exterior rated silver liquid enamel, or an outdoor exterior rated reflective liquid paint.

20. The method of claim 19, wherein in a liquid state the reflective coating further includes no more than ten percent of a solid comprising: (a) sea salt; or (b) powdered glass; or (c) crushed or powdered quartz; or (d) crushed or powdered white quartz; or (e) light-colored sand.

21. The method of claim 14, wherein the first component (a) is in crushed or powdered form, or (b) has a size of 841 micron, or smaller, or wherein the silicon dioxide has no more than a 1.4 angularity, and has a fineness modulus of no more than 3.7, or wherein the light-colored sand has no more than a 1.4 angularity, and has a fineness modulus of no more than 3.7.

22. The method of claim 14 further comprising:

repeating, for a portion of a plurality of the solar members, the disposing of the special coating to make a plurality of specially coated solar members; and disposing the plurality of the solar members in a solar array, wherein a portion of the plurality of the solar members disposed in the solar array comprises specially coated and another portion comprises uncoated solar members, wherein the solar array is in electrical communication via electrical circuitry with one or more inverters, wherein the electrical circuitry and the one or more inverters are configured to operate with at least a ten percent over-electrical production design capacity of the plurality when solar irradiance levels received by the solar array is about 1,000 to 1,200, wherein the design capacity is calculated as if all solar members of the plurality were uncoated solar members, and wherein the one or more inverters are configured to activate when the solar irradiance levels are seventy or less.

23. The method of claim 14, in which the disposing is on the back-sheet, wherein the special coating has a cured and dried thickness in a range of greater than zero millimeters to five millimeters.

24. The method of claim 14 further comprising:

disposing the special coating on or within a surface of a separate substrate to make a specially coated separate substrate; and disposing the specially coated separate substrate behind the solar member.

25. A method of increasing electrical output of a solar member, the method comprising:

placing a separate substrate behind the solar member; and disposing a special coating on or within the separate substrate to make a specially coated separate substrate, the special coating adapted to elastically or inelastically scatter (i) received light into at least one light wavelength, or (ii) received radiant energy into at least one radiant energy level, wherein the light wavelength and the radiant energy level are each adapted to knock electrons out of a valence band and into a conduction band of a solar cell of the solar member to produce additional electricity, wherein the received light includes direct light, or indirect light, or translucent light;

wherein the special coating comprises:

a first component comprising silicon dioxide and cement; and a second component mixed with the first component to form a wet or moist paste, the second component comprises a wet liquid, the wet liquid including: water; and a non-corrosive outdoor rated exterior liquid paint, or a non-corrosive outdoor rated exterior liquid enamel, or a non-corrosive outdoor rated exterior liquid glue.

26. The method of claim 25 in which the first component further comprises obsidian, or salt, or sea salt, or limestone, or sandstone, or granite, or quartz, or white quartz, or light colored sand, or a prism material, or diamond, or phosphor, or down-conversion crystals, or up-conversion crystals, or no more than ten percent silicon carbide.

27. The method of claim 26, wherein the obsidian is at least eighty percent pure, wherein the salt is at least eighty percent pure, wherein the sea salt is at least eighty percent pure, wherein the silicon dioxide is at least eighty percent pure, wherein the limestone is at least eighty percent pure, wherein the sandstone is at least eighty percent pure, wherein the cement is at least eighty percent pure, wherein the quartz is at least eighty percent pure, wherein the white quartz is at least eighty percent pure, wherein light colored sand is at least eighty percent pure, wherein the prism material is at least eighty percent pure, wherein the diamond is at least eighty percent pure, wherein the phosphor is at least eighty percent pure, wherein the down-conversion crystals are at least eighty percent pure, wherein the up-conversion crystals at least eighty percent pure.

28. The method of claim 25, wherein the first component is 35% to 65% of the special coating; and wherein the second component is 65% to 35% of the special coating.

29. The method of claim 25 further comprising:

disposing, in back of or behind the special coating, a reflective material or a reflective coating, the reflective coating, when dried and cured, and the reflective material each adapted to reflect scattered light or scattered radiant energy back into the solar member, wherein the scattered light or scattered radiant energy received and reflected by the reflective material or by the reflective coating has already been elastically or inelastically scattered by the special coating into at least one light wavelength or at least one radiant energy level that knocks electrons out of the valence band and into a conduction band of the solar cell of the solar member, wherein the reflective material comprises (a) a white or light-colored sand, or (b) a biaxially-oriented polyethylene terephthalate (mylar) surface, wherein the reflective coating, before drying, comprises an outdoor exterior rated white liquid paint, or an outdoor exterior rated silver liquid paint, or an outdoor exterior rated white liquid enamel, or an outdoor exterior rated silver liquid enamel, or an outdoor exterior rated reflective liquid paint.

30. The method of claim 29, wherein in a liquid state the reflective coating further includes no more than ten percent of a solid comprising: (a) sea salt; or (b) powdered glass; or (c) crushed or powdered quartz; or (d) crushed or powdered white quartz; or (e) light-colored sand.

31. The method of claim 29 in which the separate substrate includes aluminum, wherein the special coating is disposed on the separate substrate, the method further comprising:

disposing a coating of paint or enamel on the separate substrate before: (a) the reflective coating, or (b) the special coating.

32. The method of claim 25, wherein the first component (a) is in crushed or powdered form, or (b) has a size of 841 micron, or smaller, or wherein the silicon dioxide has no more than a 1.4 angularity, and has a fineness modulus of no more than 3.7, or wherein the light-colored sand has no more than a 1.4 angularity, and has a fineness modulus of no more than 3.7.

33. The method of claim 25, wherein the solar member comprises a back-side that includes BoPET (Biaxially-oriented polyethylene terephthalate), or an acrylonitrile butadiene styrene (ABS) material.

34. The method of claim 25, wherein the specially coated separate substrate is spaced apart from the solar member by an air gap of at least 1.59 millimeters to six meters.

35. The method of claim 25 wherein the surface of the separately coated substrate is flat, or angled, or V-shaped, or concave, or circular, or semi-circular, or square, or round, or dome-shaped.

36. The method of claim 25 in which the separate substrate includes aluminum, wherein the special coating is disposed on the separate substrate, the method further comprising:

disposing a coating of paint or enamel on the separate substrate before the special coating is disposed on the separate substrate.

37. The method of claim 25, in which the disposing is on the separate substrate, wherein the special coating has a cured and dried thickness in a range of greater than zero millimeters to five millimeters.

* * * * *